(12) United States Patent
Jang et al.

(10) Patent No.: US 7,446,748 B2
(45) Date of Patent: Nov. 4, 2008

(54) DRIVING CIRCUIT INCLUDING SHIFT REGISTER AND FLAT PANEL DISPLAY DEVICE USING THE SAME

(75) Inventors: Yong-Ho Jang, Gwacheon-si (KR); Nam-Wook Cho, Gunpo-si (KR); Soo-Young Yoon, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 567 days.

(21) Appl. No.: 11/020,184

(22) Filed: Dec. 27, 2004

(65) Prior Publication Data

US 2005/0156859 A1 Jul. 21, 2005

(30) Foreign Application Priority Data

Dec. 27, 2003 (KR) ............... 10-2003-0098134
May 28, 2004 (KR) ............... 10-2004-0038075

(51) Int. Cl.
*G09G 3/36* (2006.01)
(52) U.S. Cl. .......................... 345/100; 345/92
(58) Field of Classification Search .......... 345/204, 345/55, 100, 92
See application file for complete search history.

(56) References Cited

U.S. PATENT DOCUMENTS 6,049,321 A * 4/2000 Sasaki .................. 345/99
6,426,743 B1 * 7/2002 Yeo et al. ............... 345/213
2003/0128180 A1 * 7/2003 Kim et al. .............. 345/100

FOREIGN PATENT DOCUMENTS

KR 1020020066962 A 8/2002

* cited by examiner

*Primary Examiner*—Amare Mengistu
*Assistant Examiner*—Lenworth Woolcock
(74) *Attorney, Agent, or Firm*—Birch, Stewart, Kolasch & Birch, LLP

(57) ABSTRACT

A driving circuit for a flat panel display device includes first and second generation units generating m-phase circulation enable control clocks and n-phase circulation form generation clocks; and a plurality of shift register stages generating output signals by using the m-phase circulation enable control clocks and the n-phase circulation form generation clocks. Each shift register stage includes an input terminal receiving the m-phase circulation enable control clocks; first and second nodes outputting first and second signals, respectively, using the m-phase circulation enable control clocks; a first transistor connected to the first node and receiving the n-phase circulation form generation clocks; a second transistor connected to the second node and the first transistor; and an output terminal between the first and second transistors and outputting one of the output signals.

24 Claims, 18 Drawing Sheets

US 7,446,748 B2

DRIVING CIRCUIT INCLUDING SHIFT REGISTER AND FLAT PANEL DISPLAY DEVICE USING THE SAME

This application claims the priority benefit of Korean Patent Application No. 10-2003-0098134 filed on Dec. 27, 2003 in Republic of Korea and No. 10-2004-0038075 filed on May 28, 2004 in Republic of Korea, each of which are hereby incorporated by reference for all purposes as if fully set forth herein.

BACKGROUND OF THE INVENTION

1. Field of the Invention

The invention pertains to a flat panel display, and more particularly, to a driving circuit including a shift register and a flat panel display device using the same.

2. Description of the Related Art

A cathode ray tube (CRT) is used for a display device such as television and a monitor. However, the CRT has some drawbacks such as heavy weight, large volume and high driving voltage. Accordingly, flat panel display (FPD) devices having portability and low power consumption have been the subject of much recent research due to the coming of the information age. Among the various types of FPD devices, liquid crystal display (LCD) devices and electroluminescent display (ELD) devices are widely used as monitors for notebook computers and desktop computers because of their high resolution, ability to display colors and superiority in displaying moving images.

In general, an LCD device includes two substrates disposed such that respective electrodes of the two substrates face each other. A liquid crystal layer is interposed between the respective electrodes. When a voltage is applied between the two electrodes, an electric field is generated. The electric field modulates the light transmittance of the liquid crystal layer by reorienting the liquid crystal molecules, thereby displaying images in the LCD device. On the other hand, an ELD device uses an electroluminescence phenomenon such that a light is emitted when an electric field over a critical intensity is applied to a fluorescent material. The ELD device is classified into an inorganic type and an organic type according to source exciting carriers. An organic electroluminescent display (OELD) device is widely used because of its superiority in displaying a full color image and a moving image. In addition, the OELD device has no limit in a viewing angle and has a high brightness and a low driving voltage.

FPD devices such as LCD devices and OELD devices include a circuit unit converting RGB data and several control signals of an external driving system into proper electric signals, and a display panel displaying images using the electric signals. In general, the circuit unit is formed on a substrate different from the display panel and has a gate driver and a data driver.

Recently, an active matrix type display panel where a plurality of pixel regions are disposed in matrix and a switching element such as a thin film transistor (TFT) is formed in each pixel region is widely used. The TFT is fabricated through the repetition of photolithographic processes. While the TFT in the pixel region is fabricated, a part of a driving circuit may be formed at the periphery of the pixel region. Since the driving circuit is partially formed in the display panel without the increase of photolithographic processes, a fabrication cost is reduced. Specifically, a gate driver having a relatively low driving frequency may be formed in the display panel with a high reliability.

FIG. 1 is a schematic plan view showing an active matrix type flat panel display device having a gate driver according to the related art. In FIG. 1, an active matrix type display device 10 includes a display panel 20 and a circuit unit 30 driving the display panel 20. The display panel 20 have a pixel array 22 including gate lines (not shown), data lines crossing the gate lines (not shown) to define a plurality of pixel regions, and a pixel TFT (not shown) connected to the corresponding gate and data lines, and a gate driver 24 including a plurality of driving TFTs connected to the gate lines. Since the plurality of driving TFTs are simultaneously formed with the pixel TFTs, an additional photolithographic process is not required. The circuit unit 30 includes a source circuit 32 generating several driving signals and a data driver 34 connected to the source circuit 32. The data driver 34 may have a tape carriage package (TCP) type where a driver integrated circuit (IC) 34a is formed on a flexible printed circuit (FPC).

FIG. 2 is a schematic block diagram showing the gate driver 24 of FIG. 1 according to the related art. In FIG. 2, the gate driver 24 includes a plurality of related art shift register stages "SRS1R," "SRS2R" and "SRS3R," and a clock line 26 supplying a clock to the plurality of shift register stages "SRS1R," "SRS2R" and "SRS3R." A plurality of gate lines "g1," "g2" and "g3" of the pixel array 22 (of FIG. 1) are connected to output terminals of the plurality of shift register stages "SRS1R," "SRS2R" and "SRS3R," respectively, and the plurality of shift register stages "SRS1R," "SRS2R" and "SRS3R" sequentially supply output signals to the plurality of gate lines "g1," "g2" and "g3." Since each output terminal of the shift register stage is connected to an input terminal of the next shift register stage, the gate signal of each shift register stage is used as a start signal of the next shift register stage.

FIG. 3 is a timing chart showing output signals of the gate driver 24 according to the related art. In FIG. 3, the plurality of related art shift register stages "SRS1R," "SRS2R" and "SRS3R" (of FIG. 2) sequentially supply output signals "Vg1," "Vg2," and "Vg3" respectively to the plurality of gate lines "g1," "g2" and "g3" (of FIG. 2). Accordingly, a plurality of pixel TFTs connected to the plurality of gate lines "g1," "g2" and "g3," respectively, are sequentially turned on. Since the gate driver 24 generates only a square wave, the output signals of the gate driver 24 have a simple shape and the shape of the output signals is not changed after the gate driver 24 is formed.

FIG. 4 is a schematic circuit diagram showing a gate driver using two-phase clocks in a display panel for a flat panel display device according to the related art and FIG. 5 is a schematic timing chart showing signals input to and output from the gate driver of FIG. 4.

In FIG. 4, the gate driver includes a plurality of shift register stages "SRS1R," "SRS2R" and "SRS3R" using two-phase clocks CLK1 and CLK2. Each of the shift register stages "SRS1," "SRS2" and "SRS3" includes a shift register unit "SRU1," "SRU2" or "SRU3," and first and second transistors "$T_1$" and "$T_2$" connected to each other in series and to the corresponding shift register unit. Output signals "Vg1," "Vg2" and "Vg3" are output from connection portions between the first and second transistors "$T_1$" and "$T_2$" to a plurality of gate lines "g1," "g2" and "g3" in a pixel array, respectively. In the first shift register stage "SRS1R," the first transistor "$T_1$" is connected to a first clock line 26a and the second transistor "$T_2$" is grounded. In the second shift register stage "SRS2R," the first transistor "$T_1$" is connected to a second clock line 26b and the second transistor "$T_2$" is grounded. Similarly, the first transistors "$T_1$" of the plurality of shift register stages "SRS1R," "SRS2R" and "SRS3R" are alternately connected to the first and second clock lines 26a and 26b, and the second transistors "T₂" of the plurality of shift register stages "SRS1R," "SRS2R" and "SRS3R" are grounded.

Gate electrodes of the first and second transistors "T₁" and "T₂" are connected to Q node and Qb node of the corresponding shift register unit "SRU1," "SRU2" and "SRU3," respectively. When the Q node has a high state and the Qb node has a low state, the first transistor "T₁" is turned on and the second transistor "T₂" is turned off. Accordingly, each of the shift register stages "SRS1R," "SRS2R" and "SRS3R" outputs a corresponding clock signal of one of the first and second clock lines 26a and 26b connected to the first transistor "T₁" toward the corresponding gate line "g1," "g2" or "g3."

As shown in FIG. 5, two-phase first and second clocks "CLK1" and "CLK2" of the first and second clock lines 26a and 26b alternate with each other. Since a Q1 node of the first shift register unit "SRU1" has a high state according to a start signal and the second clock "CLK2," the first shift register stage "SRS1R" outputs the first clock "CLK1." When the shift register unit uses two-phase first and second clocks "CLK1" and "CLK2," a state of Q node may be changed from high to low by the clock corresponding to the next stage.

FIG. 6 is a schematic circuit diagram showing a gate driver using three-phase clocks in a display panel for a flat panel display device according to the related art and FIG. 7 is a schematic timing chart showing signals input to and output from the gate driver of FIG. 6.

In FIG. 6, the gate driver includes a plurality of related art shift register stages "SRS1R," "SRS2R" and "SRS3R" using three-phase clocks CLK1~CLK3. Each of the shift register stages "SRS1R," "SRS2R" and "SRS3R" includes a shift register unit "SRU1," "SRU2" or "SRU3," and first and second transistors "T₁" and "T₂" connected to each other in series and to the corresponding shift register unit. Output signals "Vg1," "Vg2" and "Vg3" are output from connection portions between the first and second transistors "T₁" and "T₂" to a plurality of gate lines "g1," "g2" and "g3" in a pixel array, respectively. In the first shift register stage "SRS1R," the first transistor "T₁" is connected to a first clock line 26a (CLK1) and the second transistor "T₂" is grounded. The first transistor "T₁" is connected to a second clock line 26b (CLK2) and the second transistor "T₂" is grounded in the second shift register stage "SRS2R"; and the first transistor "T₁" is connected to a third clock line 26c (CLK3) and the second transistor "T₂" is grounded in the third shift register stage "SRS3R." In this manner, the first transistors "T₁" of the plurality of shift register stages "SRS1R," "SRS2R" and "SRS3R" are alternately connected to the first, second and third clock lines 26a, 26b and 26c, and the second transistors "T₂" of the plurality of shift register stages "SRS1R," "SRS2R" and "SRS3R" are grounded.

Gate electrodes of the first and second transistors "T₁" and "T₂" are connected to Q node and Qb node of the corresponding shift register unit "SRU1," "SRU2" or "SRU3," respectively. When the Q node has a high state and the Qb node has a low state, the first transistor "T₁" is turned on and the second transistor "T₂" is turned off in the shift register stage. Accordingly, each of the shift register stages "SRS1R," "SRS2R" and "SRS3R" outputs a corresponding clock signal of one of the first, second and third clock lines 26a, 26b and 26c connected to the first transistor "T₁" toward the corresponding gate line "g1," "g2" or "g3."

As shown in FIG. 7, the three-phase first, second and third clocks "CLK1," "CLK2" and "CLK3" of the first, second and third clock lines 26a, 26b and 26c alternately have a high state. Since a Q1 node of the first shift register unit "SRU1" has a high state according to a start signal and the third clock "CLK3," the first shift register stage "SRS1R" outputs the first clock "CLK1." When the first shift register unit uses three-phase first, second and third clocks "CLK1," "CLK2" and "CLK3," a state of Q1 node may be changed from high to low by the second clock "CLK2." Accordingly, the second clock "CLK2" is used as a disable signal of the first shift register unit "SRU1." When clocks having a phase over three are used, a state change time of Q node and Qb node is easily controlled.

As discussed above, the related art shift register uses one of two-phase, three-phase and four-phase clocks of a square wave shape. However, the output signals of the related art shift register have a simple shape and the shape of the output signals can not be changed once the related art shift register is formed. Accordingly, a gate driver including the related art shift register does not have various functions. In addition, since a plurality of transistors are required, a reliability of the gate driver is reduced.

SUMMARY OF THE INVENTION

The invention pertains to a driving circuit including a shift register and a flat panel display device using the driving circuit, which substantially obviate one or more of problems due to limitations and disadvantages of the related art.

An object of the invention is to provide a driving circuit that sequentially outputs signals of various shapes and a flat panel display device including such driving circuit.

Another object of the invention is to provide a shifter register using two circulation clock groups including n-phase enable control clocks and m-phase form generation clocks.

Additional features and advantages of the invention will be set forth in the description which follows, and in part will be apparent from the description, or may be learned by practice of the invention. The objectives and other advantages of the invention will be realized and attained by the structures particularly pointed out in the written description and claims hereof as well as the appended drawings.

The invention, in part, provides a driving circuit for a flat panel display device including: first and second generation units generating m-phase circulation enable control clocks and n-phase circulation form generation clocks; and a plurality of shift register stages generating output signals by using the m-phase circulation enable control clocks and the n-phase circulation form generation clocks, each shift register stage comprising: an input terminal receiving the m-phase circulation enable control clocks; first and second nodes outputting first and second signals, respectively, using the m-phase circulation enable control clocks; a first transistor connected to the first node and receiving the n-phase circulation form generation clocks; a second transistor connected to the second node and the first transistor; and an output terminal between the first and second transistors and outputting one of the output signals.

The invention, in part, provides a flat panel display device including: a substrate; a gate line on the substrate; a data line crossing the gate line to define a pixel region; a pixel transistor connected to the gate line and the data line; a plurality of shift register stages at periphery of the pixel region and supplying output signals to the pixel region by using m-phase circulation enable control clocks and n-phase circulation form generation clocks; and first and second generation units generating the m-phase circulation enable control clocks and the n-phase circulation form generation clocks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the invention, which are illustrated in the accompanying drawings. Wherever possible, similar reference numbers will be used throughout the drawings to refer to the same or like parts.

Figure 1:
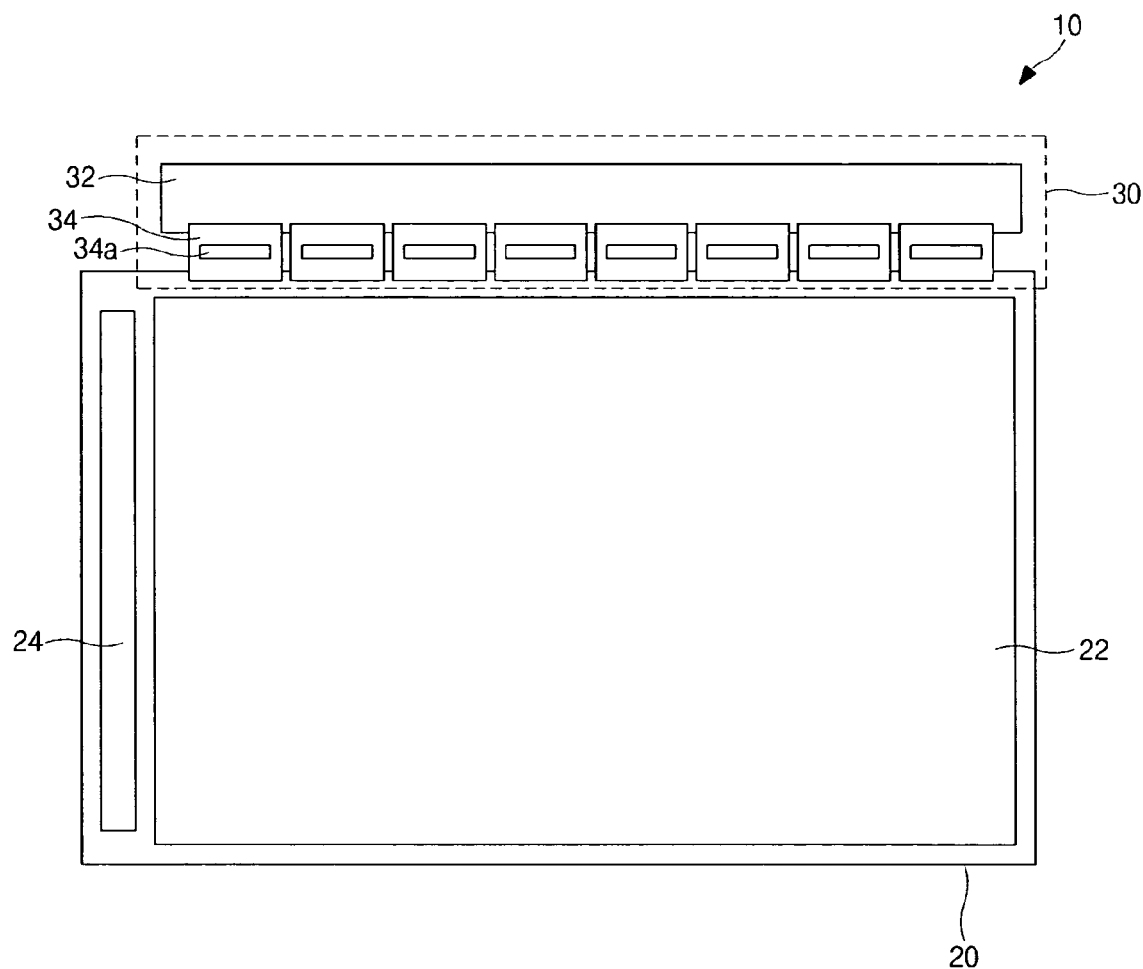
FIG. 1 is a schematic plan view showing an active matrix type flat panel display device having a gate driver according to the related art.
Figure 2:
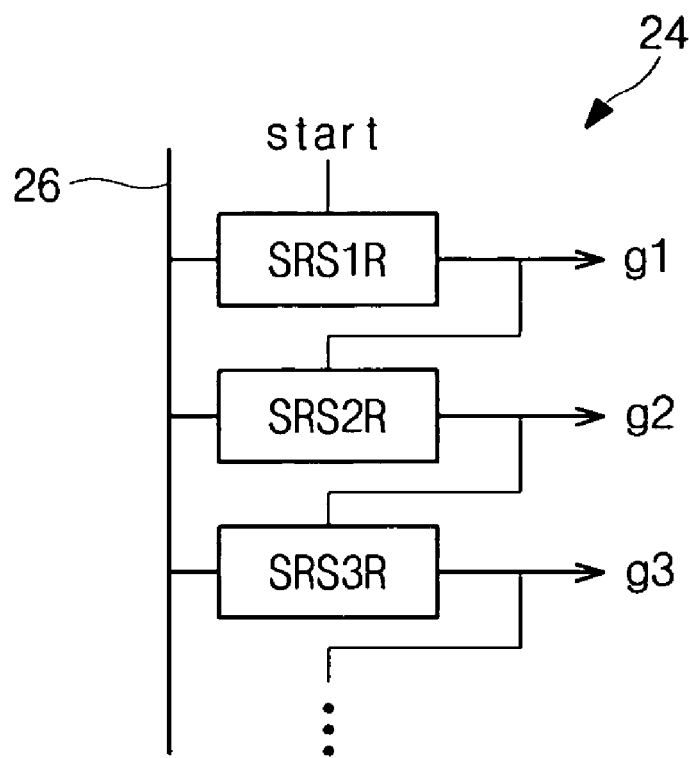
FIG. 2 is a schematic block diagram showing a gate driver formed in a display panel for a flat panel display device according to the related art.
Figure 3:
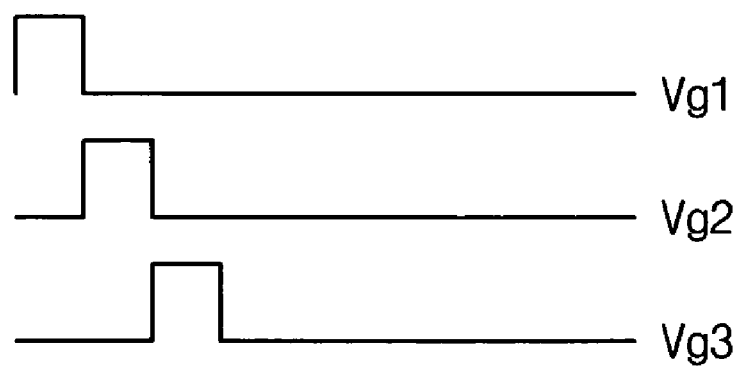
FIG. 3 is a timing chart showing output signals of the gate driver of FIG. 2 according to the related art.
Figure 4:
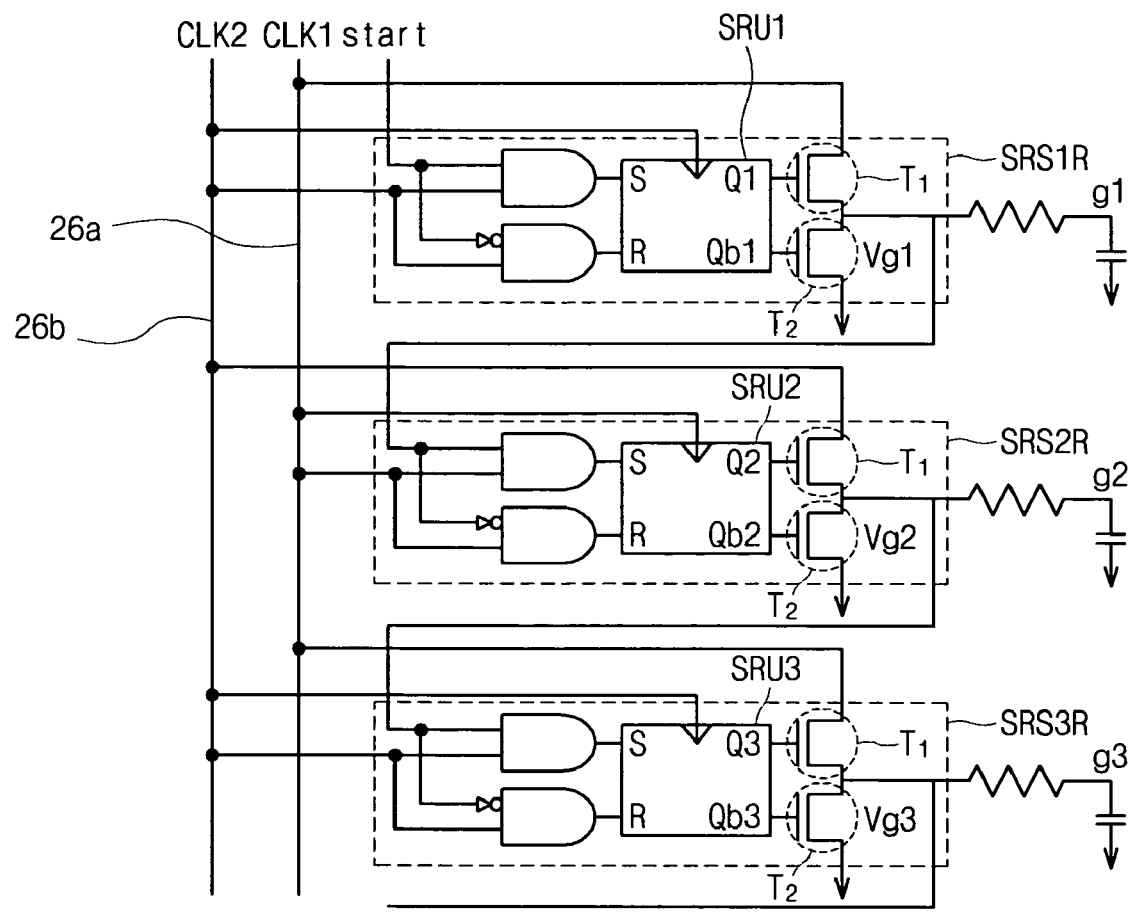
FIG. 4 is a schematic circuit diagram showing a gate driver using two-phase clocks in a display panel for a flat panel display device according to the related art.
Figure 5:
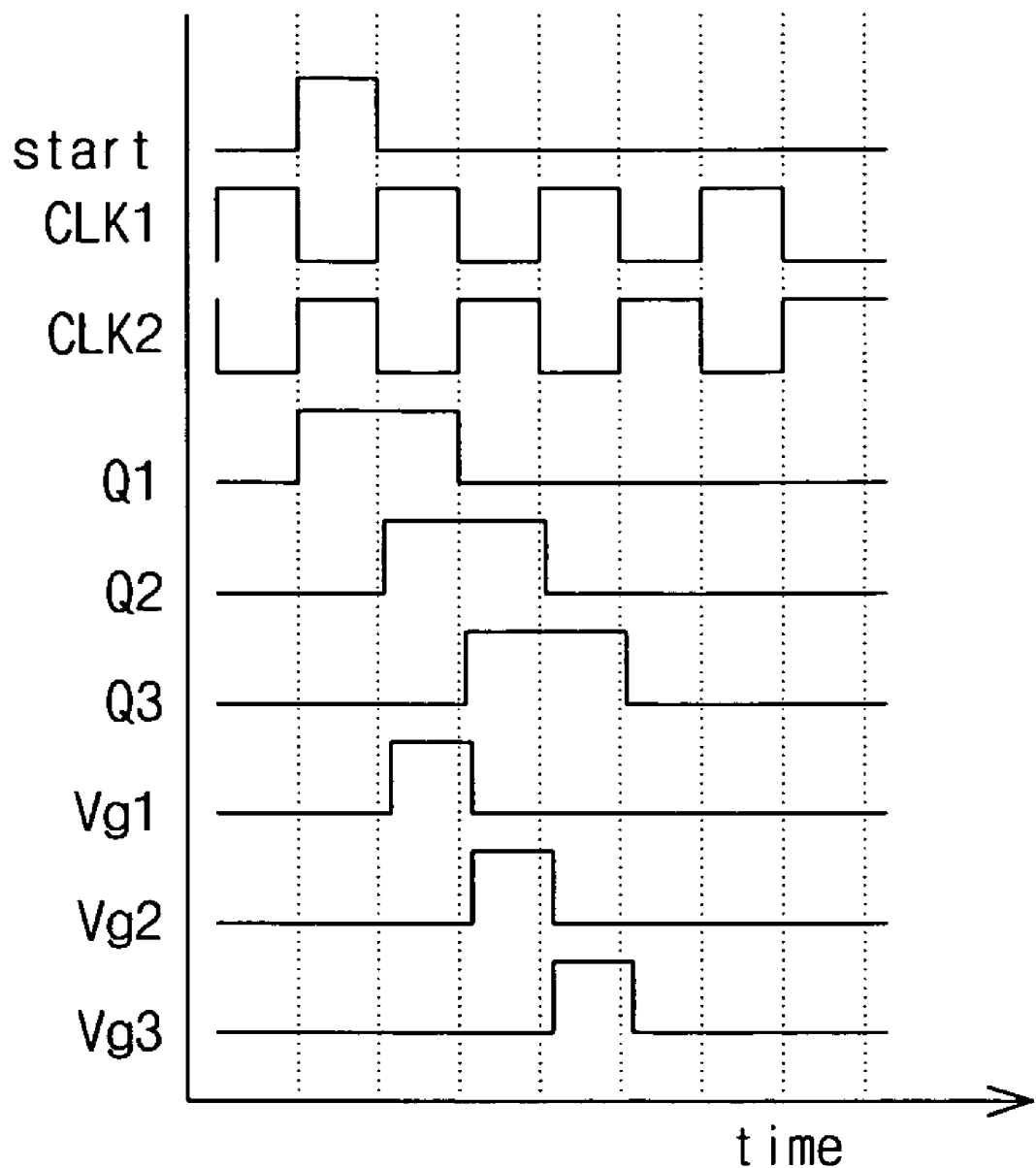
FIG. 5 is a schematic timing chart showing signals input to and output from the gate driver of FIG. 4.
Figure 6:
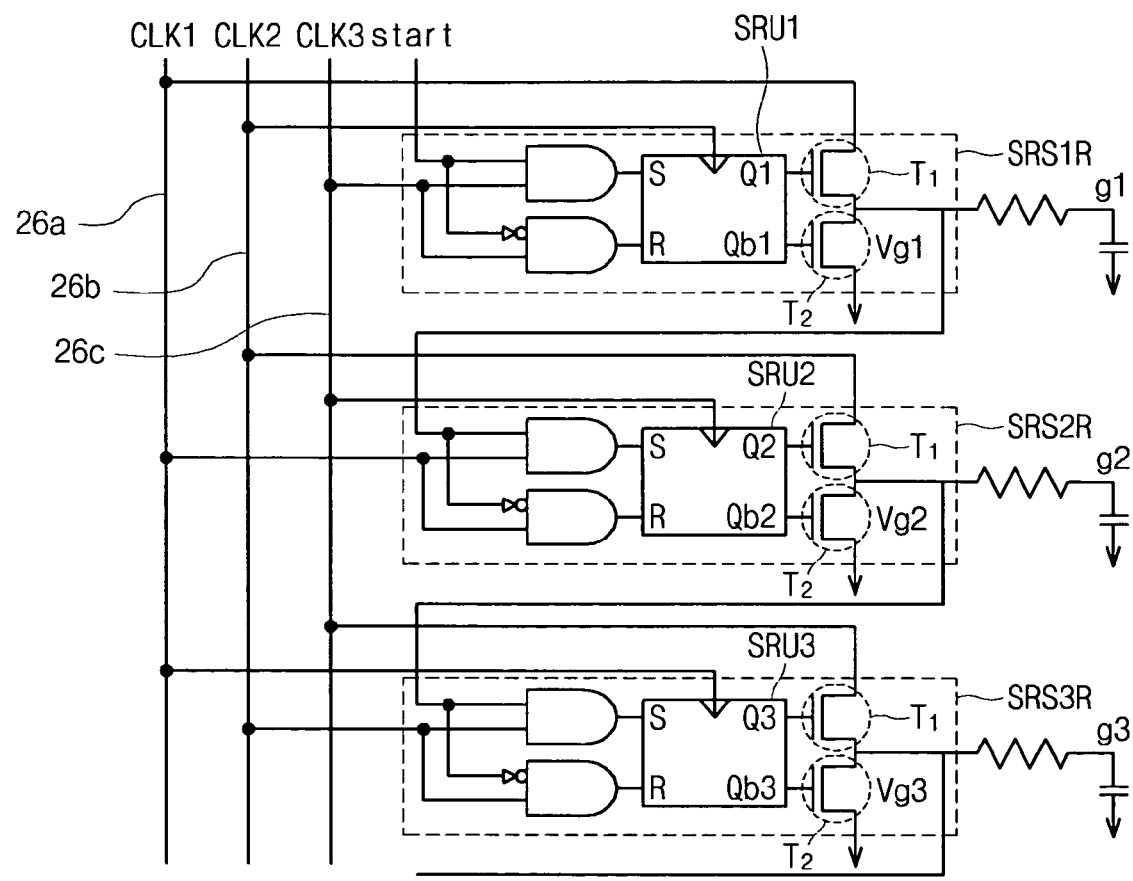
FIG. 6 is a schematic circuit diagram showing a gate driver using three-phase clocks in a display panel for a flat panel display device according to the related art.
Figure 7:
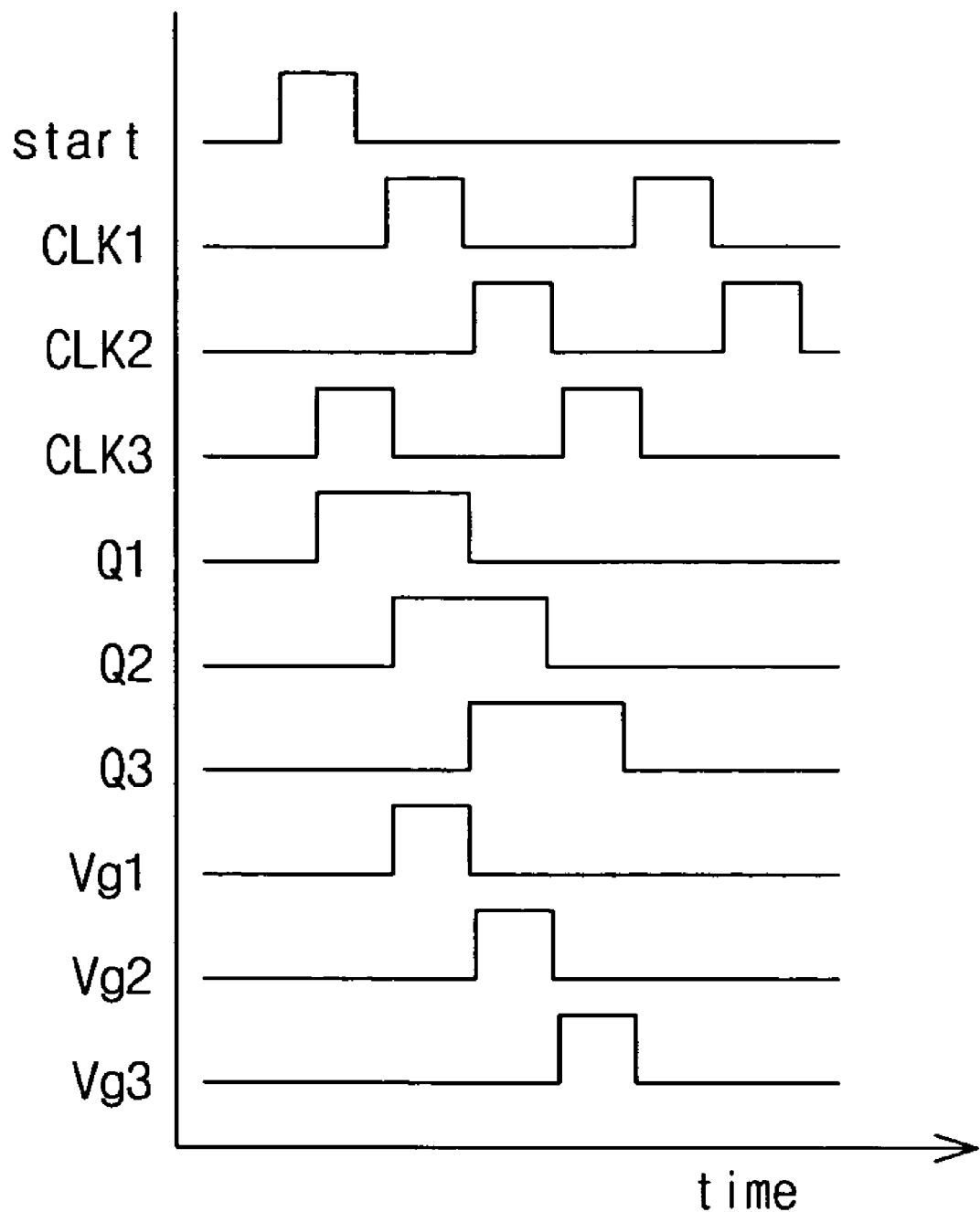
FIG. 7 is a schematic timing chart showing signals input to and output from the gate driver of FIG. 6.
Figure 8:
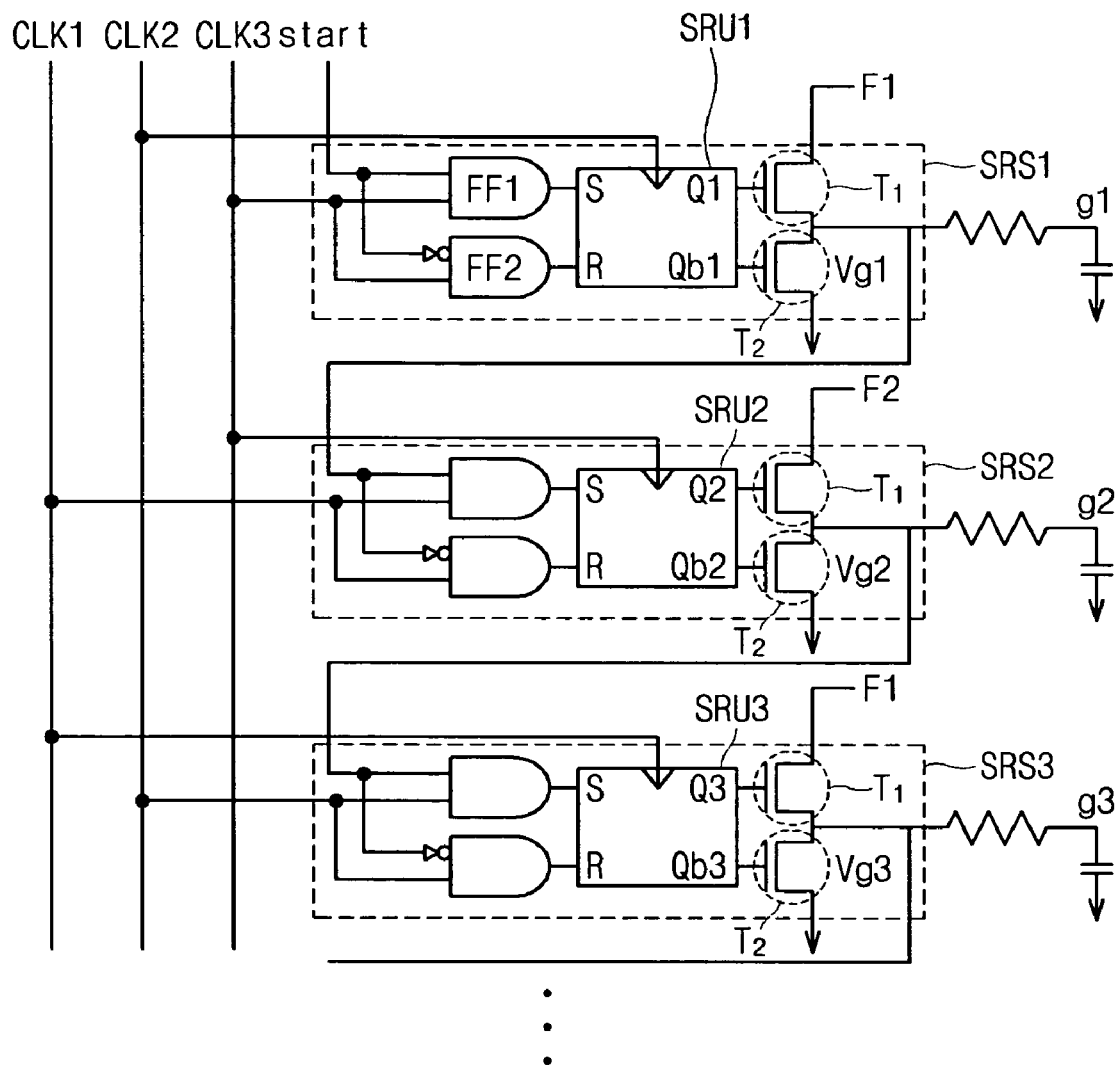
FIG. 8 is a schematic circuit diagram showing a driving circuit in a display panel for a flat panel display device according to an embodiment of the present invention.

FIG. 8 is a schematic circuit diagram showing a driving circuit in a display panel for a flat panel display device according to a first embodiment of the present invention.

In FIG. 8, the driving circuit includes a plurality of shift register stages "SRS1," "SRS2", "SRS3" . . . . For the sake of brevity, only three shift register stages are shown and explained. Each of the shift register stages "SRS1," "SRS2" and "SRS3" includes a shift register unit "SRU1," "SRU2" or "SRU3," a first transistor "$T_1$," and a second transistor "$T_2$." For each shift register stage, the first and second transistors "$T_1$" and "$T_2$" are connected to each other in series and are connected to Q and Qb nodes of the corresponding shift register unit "SRU1," "SRU2" or "SRU3". A plurality of output signals "Vg1," "Vg2" and "Vg3" are sequentially output from connection portions of the first and second transistors "$T_1$" and "$T_2$" toward a plurality of gate lines "g1," "g2" and "g3", respectively. Each of the gate signals "Vg1," "Vg2" and "Vg3" is input to the next shift register stage. That is, each of the shift register stages "SRS1", "SRS2" and "SRS3" also includes flip flops FF1 and FF2, wherein the flip flop FF1 receives the corresponding gate signal "Vg1", Vg2" . . . . All the components of the driving circuit are operatively coupled.

In the first shift register stage "SRS1," a first form generation clock "F1" is input to the first transistor "$T_1$" through a first form generation clock line and the second transistor "$T_2$" is grounded. In the second shift register stage "SRS2," a second form generation clock "F2" is input to the first transistor "$T_1$" through a second form generation clock line and the second transistor "$T_2$" is grounded. In this manner, the first and second form generation clocks "F1" and "F2" are alternately input to the first transistors "$T_1$" of the plurality of shift register stages "SRS1," "SRS2", "SRS3" . . . through the first and second form generation clock lines, and the second transistors "$T_2$" of the plurality of shift register stages "SRS1," "SRS2", "SRS3" . . . are grounded. In each of the shift register units, gate electrodes of the first and second transistors "$T_1$" and "$T_2$" are connected respectively to the Q and Qb nodes.

Second and third enable control clocks "CLK2" and "CLK3" are input to the first shift register stage "SRS1." In addition, third and first enable control clocks "CLK3" and "CLK1" are input to the second shift register stage "SRS2," and first and second enable control clocks "CLK1" and "CLK2" are input to the third shift register stage "SRS3." In this manner, two of the first, second and third enable control clocks "CLK1," "CLK2" and "CLK3" are alternately input to the plurality of shift register stages "SRS1," "SRS2", "SRS3" . . . . States of the Q and Qb nodes of each of the shift register units "SRU1," "SRU2" and "SRU3" are determined by the first, second and third enable control clocks "CLK1," "CLK2" and "CLK3."

When the Q node has a high state and the Qb node has a low state, the first transistor "$T_1$" is turned on and the second transistor "$T_2$" is turned off. Accordingly, each of the shift register stages "SRS1," "SRS2" and "SRS3" outputs one of the first and second form generation clocks "F1" and "F2" input to the first transistor "$T_1$" toward the corresponding gate line "g1," "g2" or "g3." As a result, the first and second form generation clocks "F1" and "F2" are alternately output from the plurality of shift register stages "SRS1," "SRS2", "SRS3" . . . . For instance, odd SRS's may output the first form generation clock "F1", whereas even SRS's may output the second form generation clock "F2."

Figure 9:
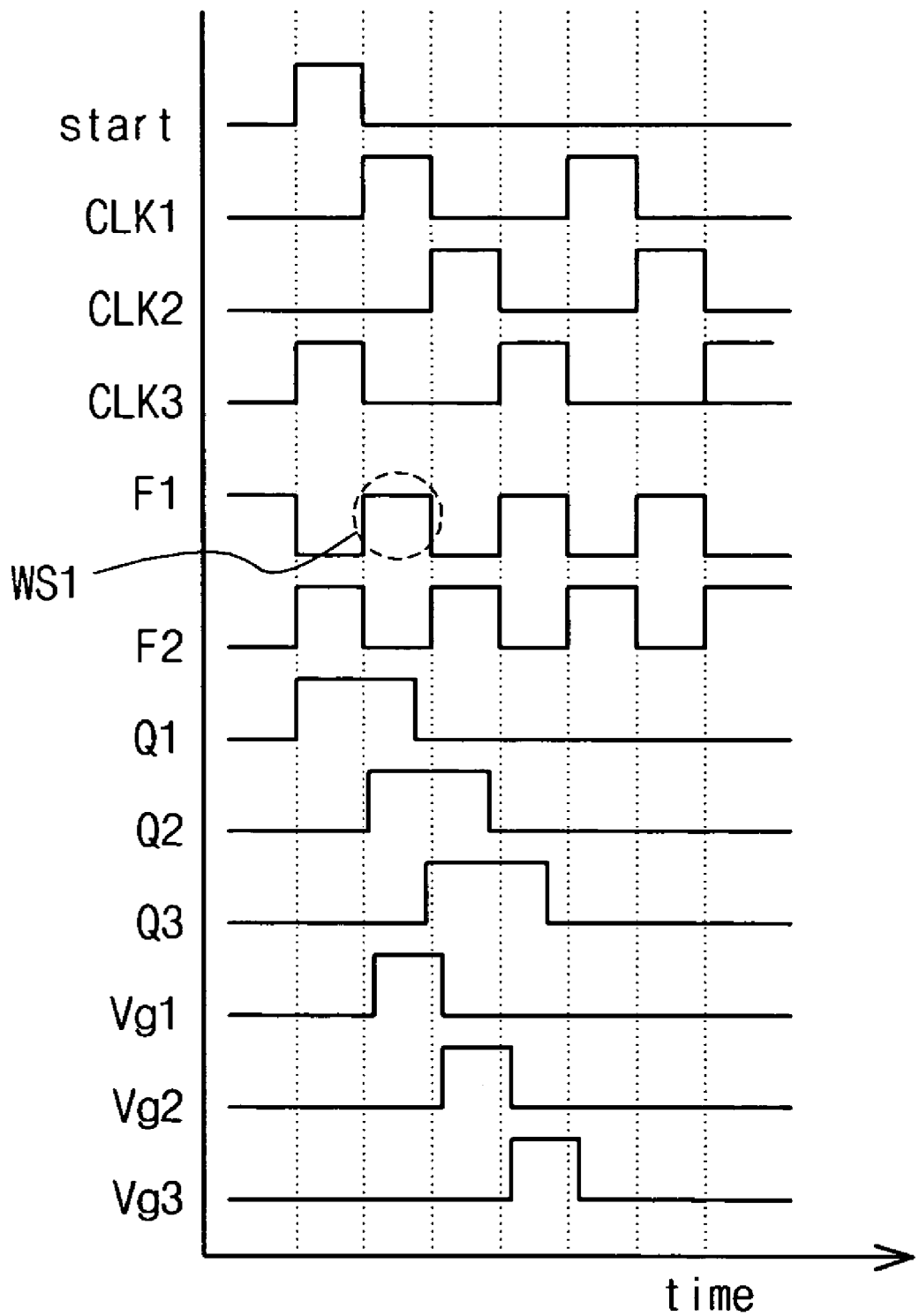
FIG. 9 is a schematic timing chart showing an example of signals input to and output from the driving circuit of FIG. 8 according to the present invention.

FIG. 9 is a schematic timing chart showing one example of signals input to and output from the driving circuit of FIG. 8 according to the present invention. In this example, the two-phase form generation clocks "F1" and "F2" have a square wave shape WS1.

In FIG. 9, the high state of Q nodes of the plurality of shift register units "SRU1," "SRU2" and "SRU3" is shifted by the three-phase enable control clocks "CLK1," "CLK2" and "CLK3" and the outputs of the plurality of shift register stages "SRS1," "SRS2" and "SRS3" are determined by the two-phase form generation clocks "F1" and "F2" having a square wave shape WS1. Accordingly, the driving circuit including the plurality of shift register stages can generate sequential output signals having a square wave shape by using the three-phase enable control clocks "CLK1," "CLK2" and "CLK3" and the two-phase form generation clocks "F1" and "F2."

Figure 10:
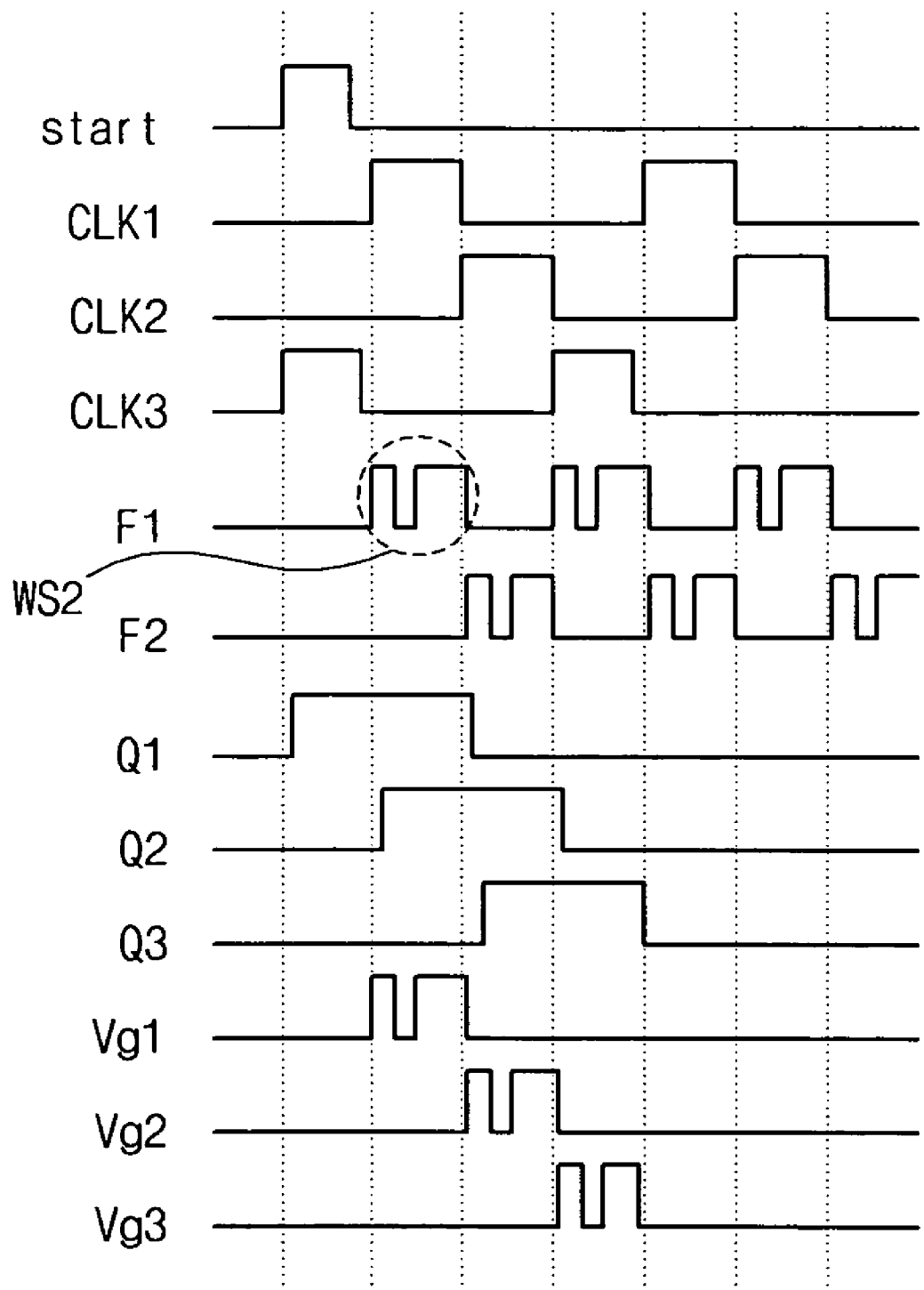
FIG. 10 is a schematic timing chart showing another example of signals input to and output from the driving circuit of FIG. 8 according to the present invention.

FIG. 10 is a schematic timing chart showing another example of signals input to and output from the driving circuit of FIG. 8 according to the present invention. In this example, the two-phase form generation clocks "F1" and "F2" have a multiple-pulse wave shape WS2.

In FIG. 10, the high state of Q nodes of the plurality of shift register units is shifted by the three-phase enable control clocks "CLK1," "CLK2" and "CLK3" and the outputs of the plurality of shift register stages are determined by the two-phase form generation clocks "F1" and "F2." Even though the three-phase enable control clocks "CLK1," "CLK2" and "CLK3" have a square wave shape, the two-phase form generation clocks "F1" and "F2" do not have a square wave shape. In this example, the clocks "F1" and "F2" have a multiple-pulse wave type shape WS2. Accordingly, the driving circuit including the plurality of shift register stages can generate sequential signals having a shape different from the square wave shape.

As shown in FIGS. 9 and 10, the driving circuit including the plurality of shift register stages can output various signals having various shapes by changing the form generation clocks. In this regard, the form generation clocks having any shape/size can be used. Accordingly, output signals of the driving circuit can be varied even after the driving circuit is formed and a fixation of output signal shape is improved.

Figure 11:
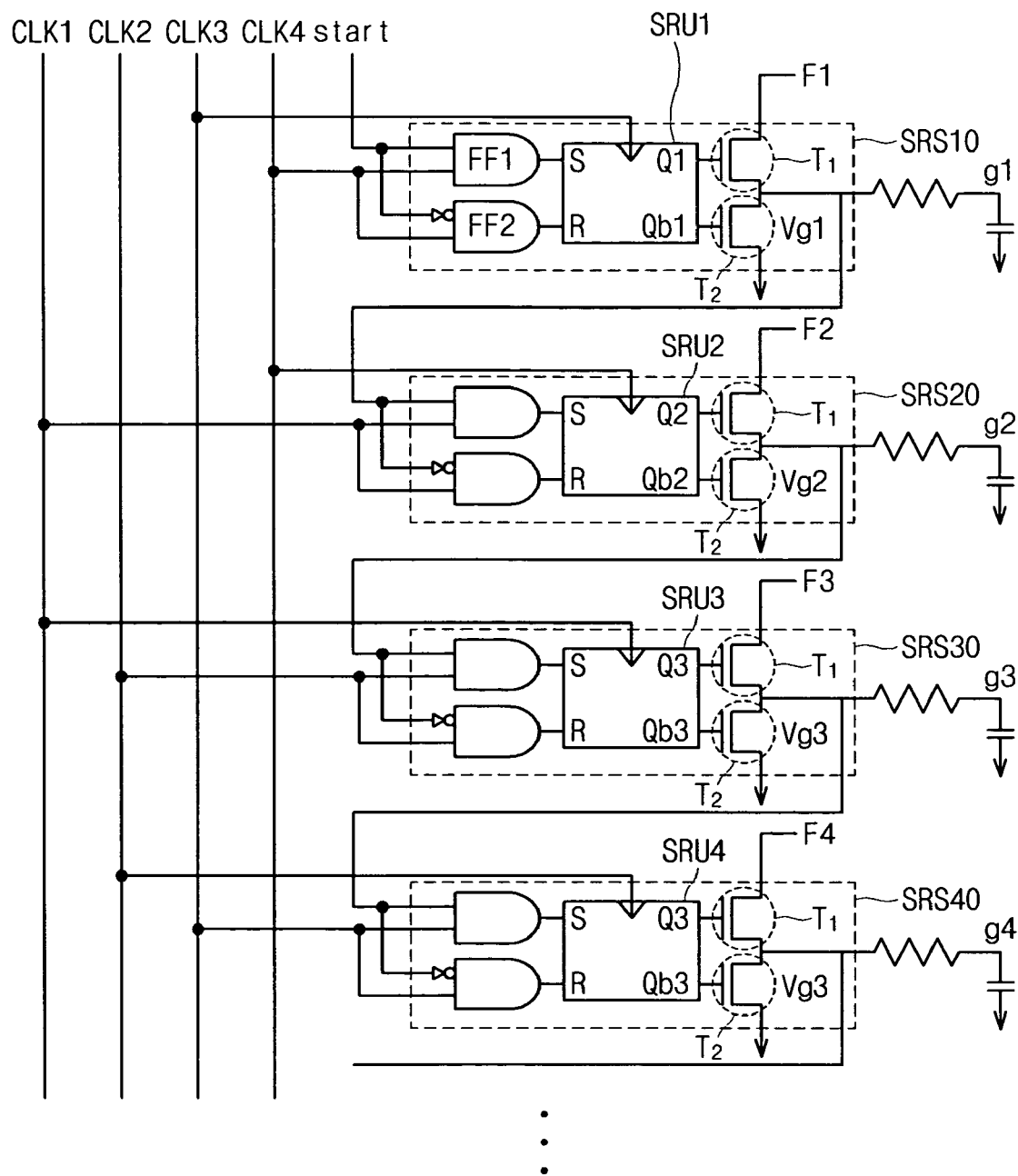
FIG. 11 is a schematic circuit diagram showing a driving circuit in a display panel for a flat panel display device according to another embodiment of the present invention.

FIG. 11 is a schematic circuit diagram showing a driving circuit in a display panel for a flat panel display device according to another embodiment of the present invention.

In FIG. 11, the driving circuit includes a plurality of shift register stages "SRS10," "SRS20," "SRS30", "SRS40" . . . . For the sake of brevity, only 4 shift register stages are shown and explained. Each of the shift register stages "SRS10," "SRS20," "SRS30" and "SRS40" includes a shift register unit "SRU1," "SRU2," "SRU3" or "SRU4," a first transistor "$T_1$" and a second transistor "$T_2$." All the components of the driving circuit are operatively coupled.

For each shift register stage, the first and second transistors "$T_1$" and "$T_2$" are connected to each other in series and are connected to Q and Qb nodes of the corresponding shift register unit "SRU1," "SRU2," "SRU3" or "SRU4." A plurality of output signals "Vg1," "Vg2," "Vg3" and "Vg4" are sequentially output from connection portions of the first and second transistors "$T_1$" and "$T_2$" toward respectively a plurality of gate lines "g1," "g2," "g3" and "g4." In addition, each of the gate signals "Vg1," "Vg2," "Vg3" and "Vg4" is input to the next shift register stage "SRS20," "SRS30," "SRS40" . . . . That is, each of the shift register stages also includes flip flops FF1 and FF2, wherein the flip flop FF1 receives the gate signal output from the preceding shift register stage.

In the first shift register stage "SRS10," a first form generation clock "F1" is input to the first transistor "$T_1$" through a first form generation clock line and the second transistor "$T_2$" is grounded. In the second shift register stage "SRS20," a second form generation clock "F2" is input to the first transistor "$T_1$" through a second form generation clock line and the second transistor "$T_2$" is grounded. Similarly, third and fourth form generation clocks "F3" and "F4" are input to the first transistors "$T_1$" of the third and fourth shift register stages "SRS30" and "SRS40," respectively, and the second transistors "$T_2$" of the third and fourth shift register stages "SRS30" and "SRS40" are grounded. In this manner, the first, second, third and fourth form generation clocks "F1," "F2," "F3" and "F4" are alternately input to the first transistors "$T_1$" of the plurality of shift register stages "SRS10," "SRS20," "SRS30" and "SRS40" . . . , and the second transistors "$T_2$" of the plurality of shift register stages "SRS10," "SRS20," "SRS30", "SRS40" . . . are grounded. For each shift register unit, gate electrodes of the first and second transistors "$T_1$" and "$T_2$" are connected to the Q and Qb nodes of the corresponding shift register unit.

Third and fourth enable control clocks "CLK3" and "CLK4" are input to the first shift register stage "SRS10." Fourth and first enable control clocks "CLK4" and "CLK1" are input to the second shift register stage "SRS20." First and second enable control clocks "CLK1" and "CLK2" are input to the third shift register stage "SRS30," and second and third enable control clocks "CLK2" and "CLK3" are input to the fourth shift register stage "SRS40." In this manner, two of the first, second, third and fourth enable control clocks "CLK1," "CLK2," "CLK3" and "CLK4" are alternately input to the plurality of shift register stages "SRS10," "SRS20," "SRS30", "SRS40" . . . . States of the Q and Qb nodes of each of the shift register units "SRU1," "SRU2," "SRU3" and "SRU4" are determined by the first, second, third and fourth enable control clocks "CLK1," "CLK2," "CLK3" and "CLK4."

When the Q node has a high state and the Qb node has a low state, the first transistor "$T_1$" is turned on and the second transistor "$T_2$" is turned off. Accordingly, each of the shift register stages "SRS10," "SRS20," "SRS30" and "SRS40" outputs one of the first, second, third and fourth form generation clocks "F1," "F2," "F3" and "F4" input to the first transistor "$T_1$" toward the corresponding gate line "g1," "g2," "g3" or "g4." As a result, the first, second, third and fourth form generation clocks "F1," "F2," "F3" and "F4" are output respectively from the plurality of shift register stages "SRS10," "SRS20," "SRS30" and "SRS40."

Figure 12:
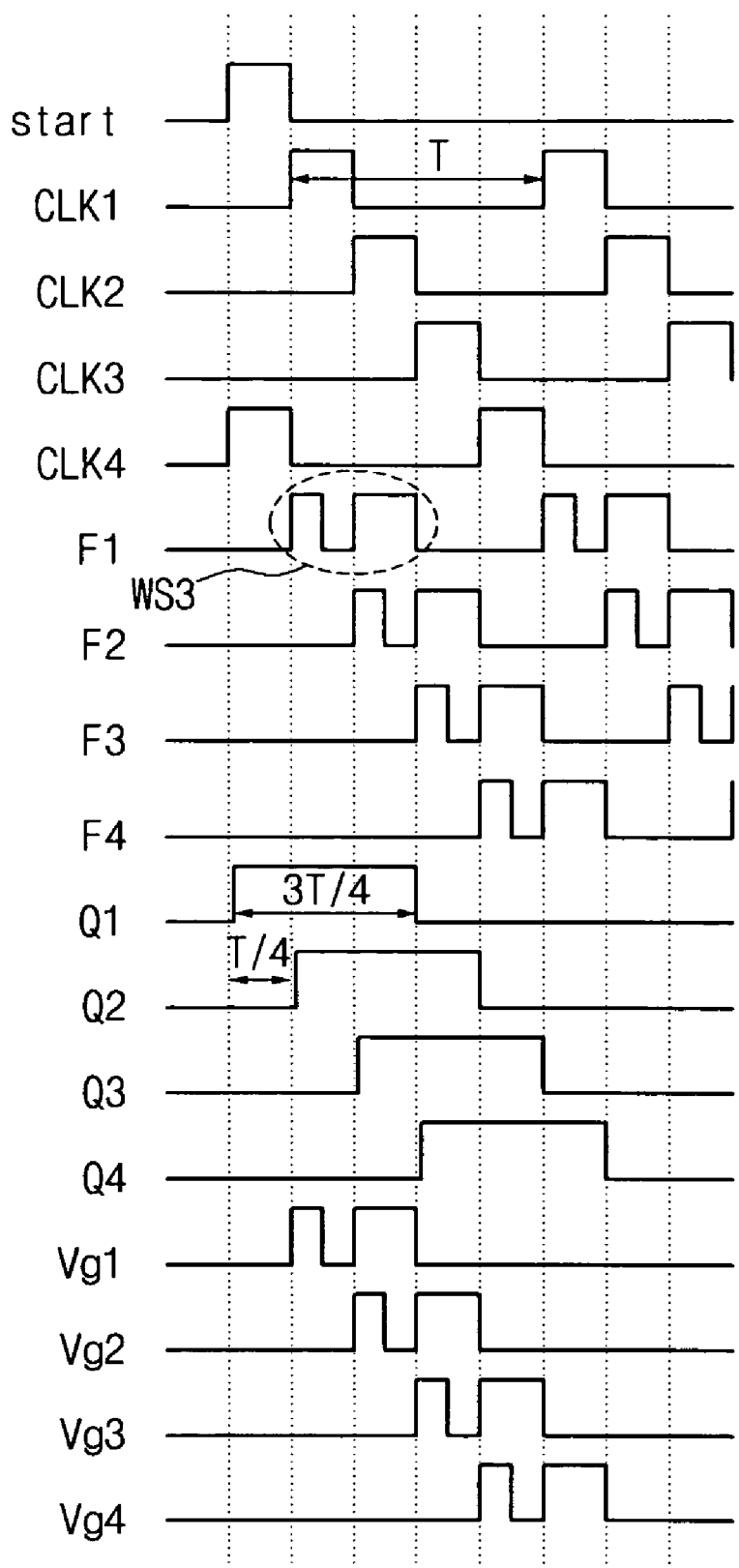
FIG. 12 is a schematic timing chart showing an example of signals input to and output from the driving circuit of FIG. 11 according to the present invention.

FIG. 12 is a schematic timing chart showing one example of signals input to and output from the driving circuit of FIG. 11 according to the present invention.

In FIG. 12, the high state of Q nodes of the plurality of shift register units "SRU1," "SRU2," "SRU3" and "SRU4" is shifted by the four-phase enable control clocks "CLK1," "CLK2," "CLK3" and "CLK4" and the outputs of the plurality of shift register stages "SRS10," "SRS20," "SRS30" and "SRS40" are determined by the four-phase form generation clocks "F1," "F2," "F3" and "F4." The four-phase enable control clocks "CLK1," "CLK2," "CLK3" and "CLK4" have a square wave shape, and the form generation clocks "F1," "F2," "F3" and "F4" have a shape (WS3) of two separated square waves having different pulse widths. The first form generation clock "F1" partially overlaps the fourth form generation clock "F4."

The first Q node "Q1" of the first shift register unit "SRU1" has a high state for 3T/4 (T is a period of each enable control clock "CLK1," "CLK2," "CLK3" and "CLK4"), and the second Q node "Q2" of the second shift register unit "SRU2" has a high state for 3T/4 shifted from the high state of the first Q node "Q1" by T/4. While the Q nodes of the plurality of shift register units "SRU1," "SRU2," "SRU3" and "SRU4" have a high state, the output signals "Vg1," "Vg2," "Vg3" and "Vg4" are sequentially generated and applied respectively to the plurality of gate lines "g1," "g2," "g3" and "g4."

The identical output signals of the shift register stages are obtained even when three-phase form generation clocks are used. In general, when n-phase enable control clocks are used, identical output signals can be obtained for form generation clocks having a phase over (n−1).

As shown in FIG. 12, the driving circuit including the plurality of shift register stages can generate sequential output signals having a shape of two separated square waves having different pulse widths, by using the four-phase enable control clocks "CLK1," "CLK2," "CLK3" and "CLK4" and the four-phase form generation clocks "F1," "F2," "F3" and "F4."

Figure 13:
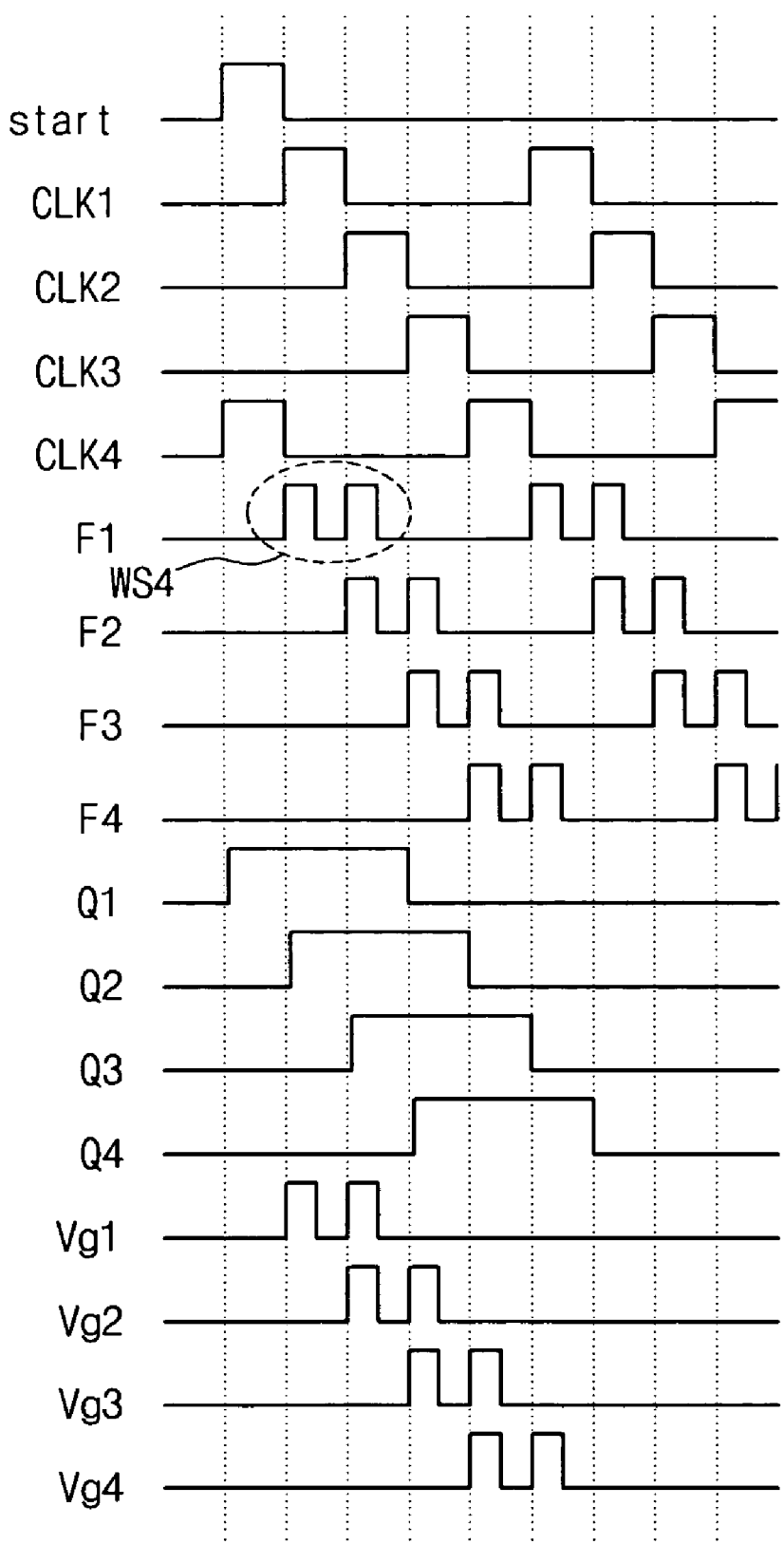
FIG. 13 is a schematic timing chart showing another example of signals input to and output from the driving circuit of FIG. 11 according to the present invention.

FIG. 13 is a schematic timing chart showing another example of signals input to and output from the driving circuit of FIG. 11 according to the present invention.

In FIG. 13, the high state of Q nodes of the plurality of shift register units is shifted by the four-phase enable control clocks "CLK1," "CLK2," "CLK3" and "CLK4" and the outputs of the plurality of shift register stages are determined by the four-phase form generation clocks "F1," "F2," "F3" and "F4." Although the four-phase enable control clocks "CLK1," "CLK2," "CLK3" and "CLK4" have a square wave shape, the four-phase form generation clocks "F1," "F2," "F3" and "F4" have a shape (WS4) of two separated square waves having identical or equal pulse widths. Accordingly, the driving circuit including the plurality of shift register stages can generate sequential signals having a shape different from a square wave shape.

As shown in FIGS. 12 and 13, the driving circuit including the plurality of shift register stages outputs various signals having shapes different from each other by using the form generation clocks having various shapes different from each other. Accordingly, the output signals of the driving circuit may be varied even after the driving circuit is formed and a fixation problem of output signal shape is effectively solved.

Figure 14:
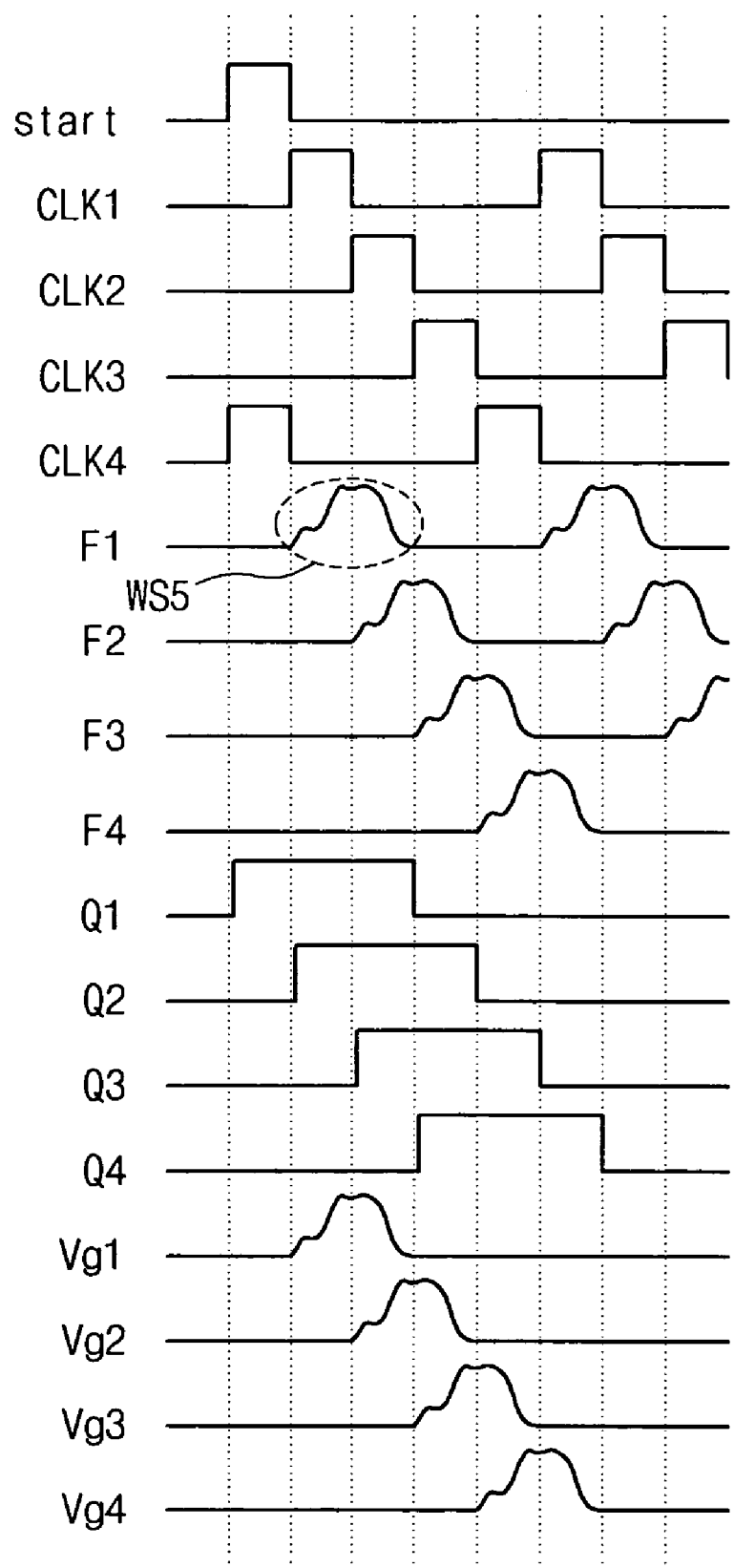
FIG. 14 is a schematic timing chart showing another example of signals input to and output from the driving circuit of FIG. 11 according to the present invention.

FIG. 14 is a schematic timing chart showing another example of signals input to and output from the driving circuit of FIG. 11 according to the present invention.

In FIG. 14, the high state of Q nodes of the plurality of shift register units is shifted by the four-phase enable control clocks "CLK1," "CLK2," "CLK3" and "CLK4" and the outputs of the plurality of shift register stages are determined by the four-phase form generation clocks "F1," "F2," "F3" and "F4." Although the four-phase enable control clocks "CLK1," "CLK2," "CLK3" and "CLK4" have a square wave shape, the four-phase form generation clocks "F1," "F2," "F3" and "F4" have an arbitrary shape (WS5) that can be interpreted by a sum of indefinite sinusoidal waves having different amplitudes and periods. When a shift register outputting signals of an arbitrary shape is formed in a display panel, a driving circuit including the shift register has a low reliability and a low stability because the shift register is complex. In the present invention, however, the form generation clocks having an arbitrary shape may be supplied from an external circuit such as a timing controller with stability and reliability.

Accordingly, a driving circuit including a shift register according to the present invention generates output signals having a required shape by using enable control clocks having a square wave shape and using form generation clocks having a predetermined shape. The enable control clocks and the form generation clocks recur. When the output signals do not overlap each other, enable control clocks having at least three phases and form generation clocks having at least two phases may be used for generating the output signals. Referring again to FIGS. 8, 9 and 10, a period of the three-phase enable control clocks is three times as long as a pulse width of each output signal, and a period of the two-phase form generation clocks is twice as long as a pulse width of each output signal. Enable control clocks having a phase over three and form generation clocks having a phase over two may be used on the basis of a display panel and a load of the driving circuit.

When the output signals of a driving circuit overlap each other, a method of determining phases for enable control clocks and form generation clocks is illustrated hereinafter according to the present invention. When a pulse width of each output signal is p*t and the adjacent output signals overlap each other by (p−1)*t (t is a pulse width of each enable control clock and p is an integer equal to or greater than 2), the number of overlapped output signals is p. In addition, minimum phases "m" and "n" for the enable control clocks and the form generation clocks may be obtained from equations of m=p+2 and n=m−1=p+1. In the example of FIG. 14, the output signals "Vg1," "Vg2," "Vg3" and "Vg4" of the plurality of shift register stages have a pulse width of 2*t. The adjacent output signals overlap each other for t and the number "p" of the overlapped output signals is 2. Accordingly, the minimum phase "m" for the enable control clocks is 4 from m=2+2=4 and the minimum phase "n" for the form generation clocks is 3 from n=4−1=3. As a result, the identical output signals may be obtained by adjusting a period of the three-phase form generation clocks. Most of the output signals may be obtained by using enable control clocks having three phases or four phases.

Figure 15:
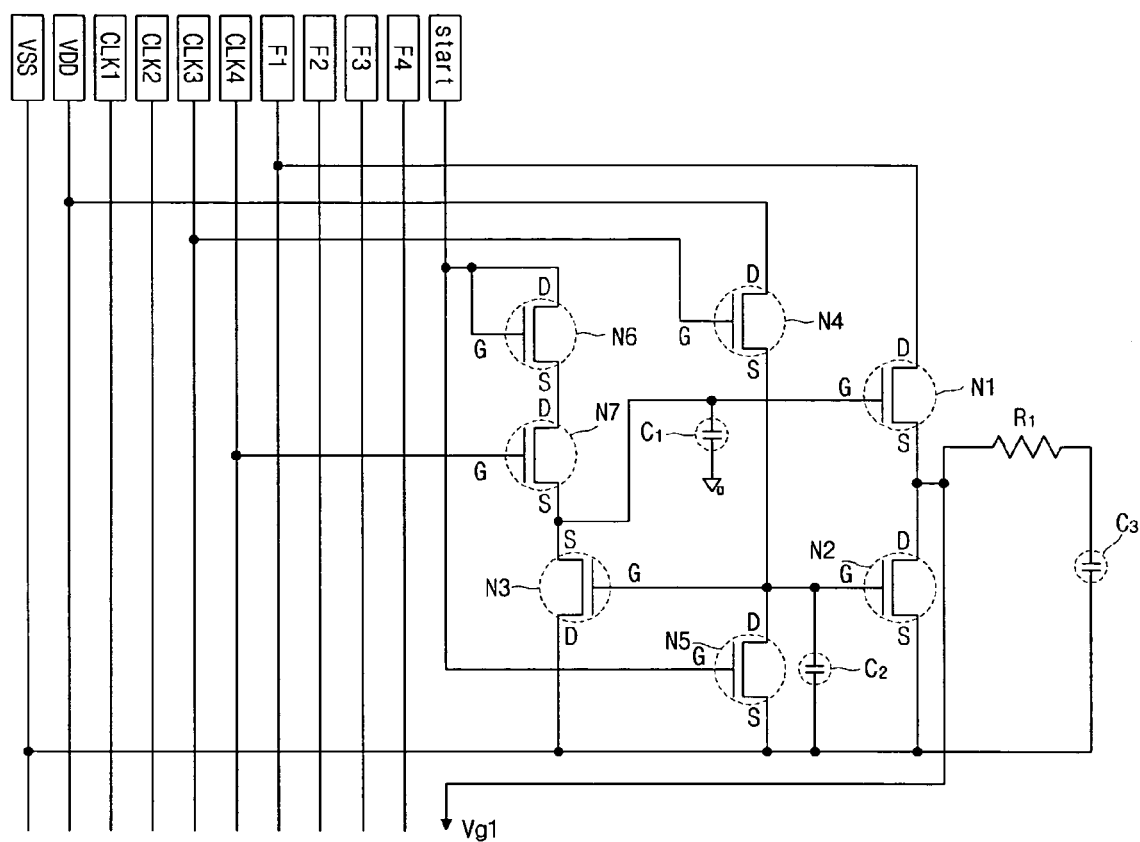
FIG. 15 is a schematic circuit diagram showing a shift register stage of a driving circuit for a flat panel display device according to another embodiment of the present invention.

FIG. 15 is a schematic circuit diagram showing a shift register stage of a driving circuit for a flat panel display device according to another embodiment of the present invention. The driving circuit here is formed by connecting a plurality of shift register stages having the same components in series, with these components having different connections as discussed below. For the sake of brevity, only a single shift register stage is shown in FIG. 15. Two of enable control clocks are input to the shift register stage of FIG. 15.

In FIG. 15, the shift register stage using four-phase enable control clocks and four-phase form generation clocks is formed of first to seventh transistors "N1" to "N7" each having a gate electrode, a source electrode and a drain electrode. The gate electrode and the drain electrode of the sixth transistor "N6" are connected to a start signal terminal "start," and the source electrode of the sixth transistor "N6" is connected to the drain electrode of the seventh transistor "N7." The gate electrode of the seventh transistor "N7" is connected to a fourth enable control clock terminal "CLK4," and the source electrode of the seventh transistor "N7" is connected to the source electrode of the third transistor "N3" and the gate electrode of the first transistor "N1." The gate electrode of the third transistor "N3" is connected to the source electrode of the fourth transistor "N4," the drain electrode of the fifth transistor "N5" and the gate electrode of the fifth transistor "N5." The drain electrode of the third transistor "N3" is connected to a ground terminal "VSS." The gate electrode and the drain electrode of the fourth transistor "N4" are connected to a third enable control clock terminal "CLK3" and a voltage source terminal "VDD," respectively. The gate electrode and the source electrode of the fifth transistor "N5" are connected to the start signal terminal "start" and the ground terminal "VSS," respectively. The drain electrode and the source electrode of the first transistor "N1" are connected to a first form generation clock terminal "F1" and the drain electrode of the second transistor "N2," respectively. The source electrode of the second transistor "N2" is connected to the ground terminal "VSS." The shift register stage may further include a first capacitor "C1," a second capacitor "C2," a third capacitor "C3" and a first resistor "R1."

The shift register stage of FIG. 15 corresponds to the first shift register stage "SRS10" of FIG. 11. In the second shift register stage, the gate electrode and the drain electrode of the sixth transistor "N6" are connected to a node between the first and second transistors "N1" and "N2" of the first shift register stage and receive an output signal of the first shift register stage; the fourth and first enable control clocks "CLK4" and "CLK1" are input to the gate electrode of the fourth transistor "N4" and the gate electrode of the seventh transistor "N7," respectively; and the second form generation clock "F2" is input to the drain electrode of the first transistor "N1." In this manner, the enable control clocks and the form generation clocks are alternately input to the plurality of shift register stages of the driving circuit, and the output signal of the previous shift register stage is input to the next shift register stage.

Figure 16:
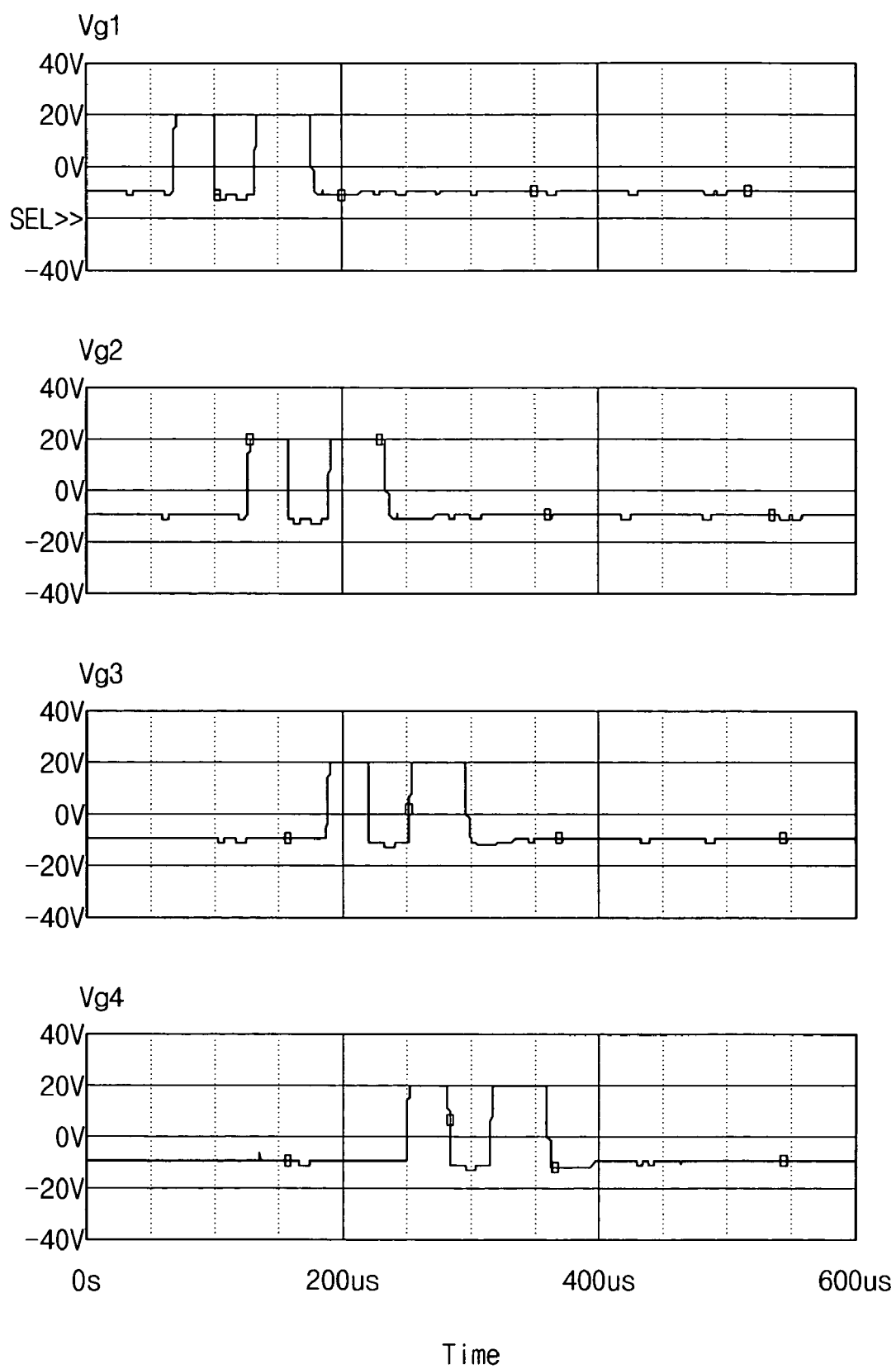
FIG. 16 is a graph showing simulated output signals of the driving circuit of FIG. 12.

FIG. 16 is a graph showing simulated output signals of the driving circuit of FIGS. 11 and 12. As shown in FIG. 16, the simulated output signals are in accordance with the first to fourth output signals "Vg1" to "Vg4" of FIG. 12.

Figure 17:
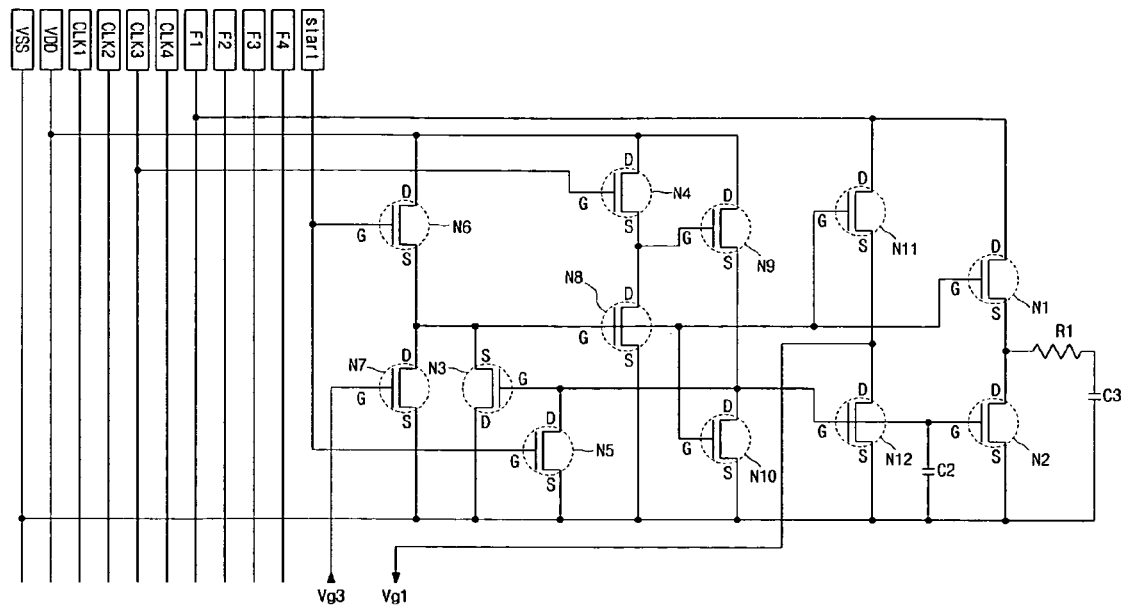
FIG. 17 is a schematic circuit diagram showing a shift register stage of a driving circuit for a flat panel display device according to another embodiment of the present invention.

FIG. 17 is a schematic circuit diagram showing a shift register stage of a driving circuit for a flat panel display device according to another embodiment of the present invention. The driving circuit here is formed by connecting a plurality of shift register stages having the same components in series, with these components having different connections as discussed below. For the sake of brevity only, a single shift register stage is shown in FIG. 17. One of enable control clocks is input to the shift register stage of FIG. 17.

In FIG. 17, the shift register stage using four-phase enable control clocks and four-phase form generation clocks is formed of first to twelfth transistors "N1" to "N12" each having a gate electrode, a source electrode and a drain electrode. The gate electrode and the drain electrode of the sixth transistor "N6" are connected to a start signal terminal "start" and a voltage source terminal "VDD," respectively. In addition, the source electrode of the sixth transistor "N6" is connected to the drain electrode of the seventh transistor "N7," the source electrode of the third transistor "N3," the gate electrode of the eighth transistor "N8," the gate electrode of the tenth transistor "N10," the gate electrode of the eleventh transistor "N11" and the gate electrode of the first transistor "N1." The source electrode of the seventh transistor "N7" is connected to a ground terminal "VSS."

The gate electrode of the third transistor "N3" is connected to the drain electrode of the fifth transistor "N5," the source electrode of the ninth transistor "N9," the drain electrode of the tenth transistor "N10," the gate electrode of the twelfth transistor "N12" and the gate electrode of the second transistor "N2." The drain electrode of the fourth transistor "N4" is connected to the drain electrode of the sixth transistor "N6" and the drain electrode of the ninth transistor "N9." In addition, the gate electrode of the fourth transistor "N4" is connected to a third enable control clock terminal "CLK3," and the source electrode of the fourth transistor "N4" is connected to the drain electrode of the eighth transistor "N8" and the gate electrode of the ninth transistor "N9." The source electrodes of the second, eighth, tenth and twelfth transistors "N2," "N8," "N10" and "N12" are connected to the ground terminal "VSS." The drain electrode of the eleventh transistor "N11" is connected to a first form generation clock terminal "F1" and the drain electrode of the first transistor "N1," and the source electrode of the eleventh transistor "N11" is connected to the drain electrode of the twelfth transistor "N12." The source electrode of the first transistor "N1" is connected to the drain electrode of the second transistor "N2."

FIG. 17 shows, for example, a shift register stage corresponding to the first shift register stage of the driving circuit such as the stage shown in FIG. 15. In FIG. 17, a first output signal "Vg1" of the first shift register stage is output from a node between the eleventh and twelfth transistors "N11" and "N12." An output voltage of the shift register stage after the next shift register stage is input to the gate electrode of the seventh transistor "N7" of the current shift register stage. As shown in FIG. 17, for example, a third output signal "Vg3" of a third shift register stage is input to the gate electrode of the seventh transistor "N7" of the first shift register stage.

In the second shift register stage of FIG. 17, the gate electrodes of the sixth and fifth transistors "N6" and "N5" are connected to the node between the eleventh and twelfth transistors "N11" and "N12" of the first shift register stage and receive the first output signal "Vg1" instead of a start signal of the start signal terminal "start"; the fourth enable control clock "CLK4" is input to the gate electrode of the fourth transistor "N4"; and the second form generation clock "F2" is input to the drain electrodes of the first and eleventh transistors "N1" and "N11." The fourth output signal "Vg4" of the fourth shift register stage is input to the gate electrode of the seventh transistor "N7" of the second shift register stage.

In this manner, in the driving circuit of FIG. 17 one of first to fourth enable control clocks and one of the first and second form generation clocks are input to each shift register stage. Moreover, the first to fourth enable control clocks and the first and second form generation clocks are alternately input to the plurality of shift register stages, thereby obtaining the first to fourth output signals "Vg1" to "Vg4," e.g., of FIG. 12.

Figure 18:
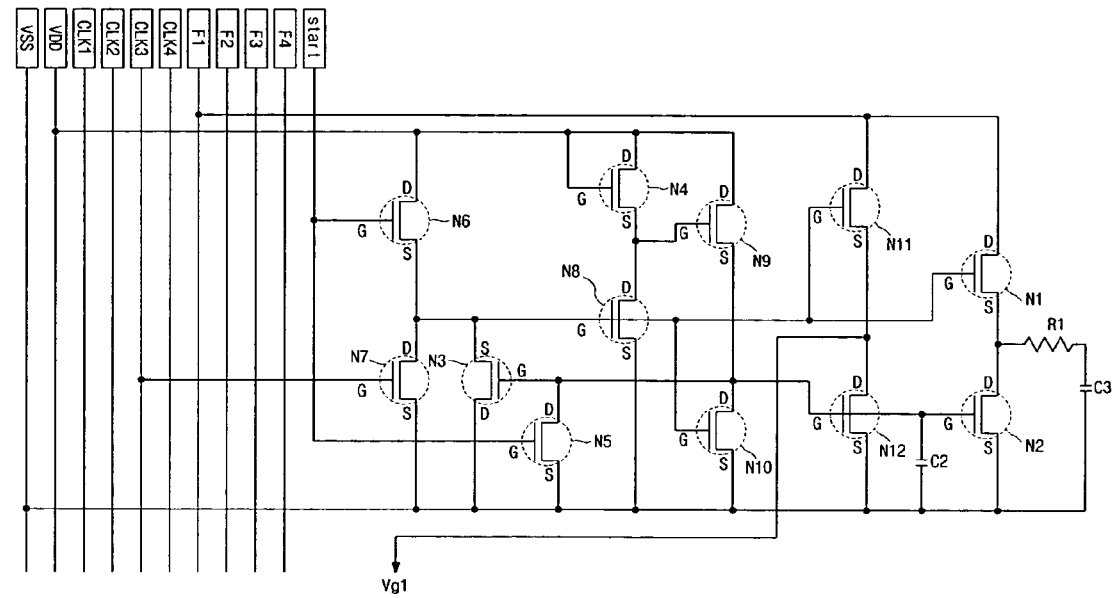
FIG. 18 is a schematic circuit diagram showing a shift register stage of a driving circuit for a flat panel display device according to another embodiment of the present invention.

FIG. 18 is a schematic circuit diagram showing a shift register stage of a driving circuit for a flat panel display device according to another embodiment of the present invention. The driving circuit here is formed by connecting a plurality of shift register stages having the same components in series, with the components having different connections as discussed below. For the sake of brevity, only a single shift register stage is shown in FIG. 18. One of enable control clocks is input to the shift register stage of FIG. 18.

In FIG. 18, the shift register stage using four-phase enable control clocks and four-phase form generation clocks is formed of first to twelfth transistors "N1" to "N12" each having a gate electrode, a source electrode and a drain electrode. The gate electrode and the drain electrode of the sixth transistor "N6" are connected to a start signal terminal "start" and a voltage source terminal "VDD," respectively. In addition, the source electrode of the sixth transistor "N6" is connected to the drain electrode of the seventh transistor "N7," the source electrode of the third transistor "N3," the gate electrode of the eighth transistor "N8," the gate electrode of the tenth transistor "N10," the gate electrode of the eleventh transistor "N11" and the gate electrode of the first transistor "N1." The gate electrode and source electrode of the seventh transistor "N7" are connected to a third enable control clock terminal "CLK3" and a ground terminal "VSS," respectively.

The gate electrode of the third transistor "N3" is connected to the drain electrode of the fifth transistor "N5," the source electrode of the ninth transistor "N9," the drain electrode of the tenth transistor "N10," the gate electrode of the twelfth transistor "N12" and the gate electrode of the second transistor "N2." The drain electrode of the third transistor "N3" is connected to the ground terminal "VSS." In addition, the gate electrode and the drain electrode of the fourth transistor "N4" is connected to the voltage source terminal "VDD" and the drain electrode of the ninth transistor "N9," and the source electrode of the fourth transistor "N4" is connected to the drain electrode of the eighth transistor "N8" and the gate electrode of the ninth transistor "N9." The source electrodes of the second, eighth, tenth and twelfth transistors "N2," "N8," "N10" and "N12" are connected to the ground terminal "VSS." The drain electrode of the eleventh transistor "N11" is connected to a first form generation clock terminal "F1" and the drain electrode of the first transistor "N1," and the source electrode of the eleventh transistor "N11" is connected to the drain electrode of the twelfth transistor "N12." The source electrode of the first transistor "N1" is connected to the drain electrode of the second transistor "N2." A first output signal "Vg1" of the first shift register stage is output from a node between the eleventh and twelfth transistors "N11" and "N12."

FIG. 18 shows, for example, the shift register stage corresponding to the first shift register stage of the driving circuit such as the stage shown in FIG. 15. In the second shift register stage of FIG. 18, the gate electrodes of the sixth and fifth transistors "N6" and "N5" are connected to the node between the eleventh and twelfth transistors "N11" and "N12" of the first shift register stage and receive the first output signal "Vg1" instead of a start signal of the start signal terminal "start"; the fourth enable control clock "CLK4" is input to the gate electrode of the seventh transistor "N7"; and the second form generation clock "F2" is input to the drain electrodes of the first and eleventh transistors "N1" and "N11."

In this manner, in the driving circuit of FIG. 18, one of first to fourth enable control clocks and one of the first and second form generation clocks are input to each shift register stage. Moreover, the first to fourth enable control clocks and the first and second form generation clocks are alternately input to the plurality of shift register stages, thereby obtaining the first to fourth output signals "Vg1" to "Vg4," e.g., of FIG. 12. In addition, the first and second transistors "N1" and "N2" of FIGS. 15, 17 and 18 correspond to the first and second transistors "$T_1$" and "$T_2$" of FIG. 8 or 11.

Figure 19:
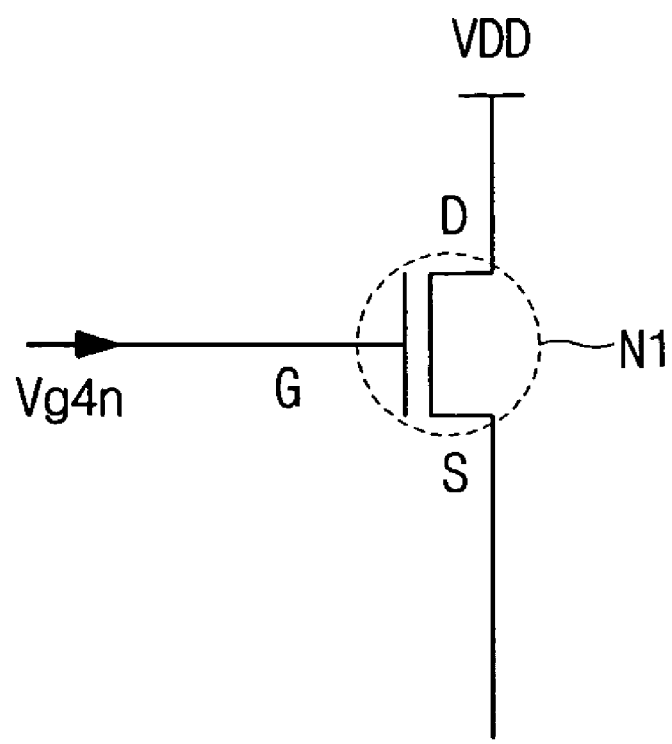
FIG. 19 is a schematic circuit diagram showing a connection of a first transistor of FIGS. 17 and 18.

FIG. 19 is a schematic circuit diagram showing an example of a connection of the first transistor N1 of FIGS. 17 and 18, and FIGS. 20 and 21 are schematic circuit diagrams of another connection having the same function as the first transistor of FIGS. 17 and 18. For example, the first transistor is formed in an $(4n+1)^{th}$ shift register stage, where n is an integer over zero.

In FIG. 19, a $4n^{th}$ output signal "Vg4n" of the previous shift register stage is input to a gate electrode of the first transistor "N1," and a drain electrode of the first transistor "N1" is connected to a voltage source terminal.

Figure 20:
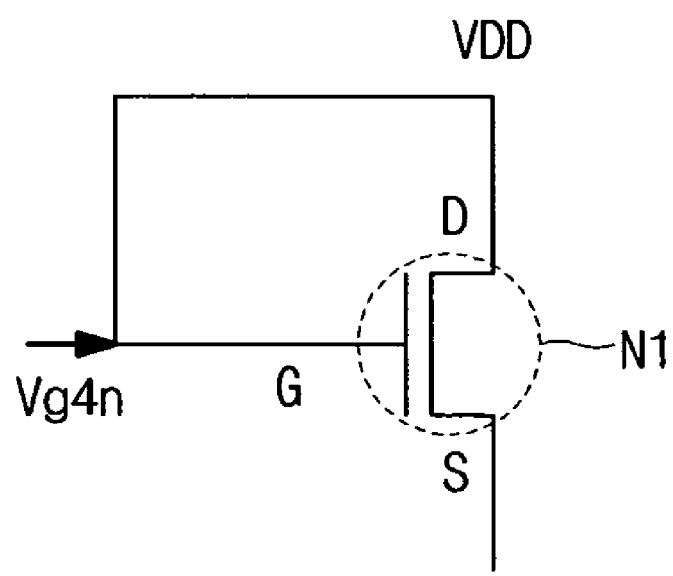
FIGS. 20 and 21 are schematic circuit diagrams of another connection having the same function as the first transistor of FIGS. 17 and 18.

In FIG. 20, a $4n^{th}$ output signal "Vg4n" of the previous shift register stage is input to a gate electrode and a source electrode of the first transistor "N1," thereby the first transistor "N1" functioning in accordance with the first transistor of FIG. 19.

Figure 21:
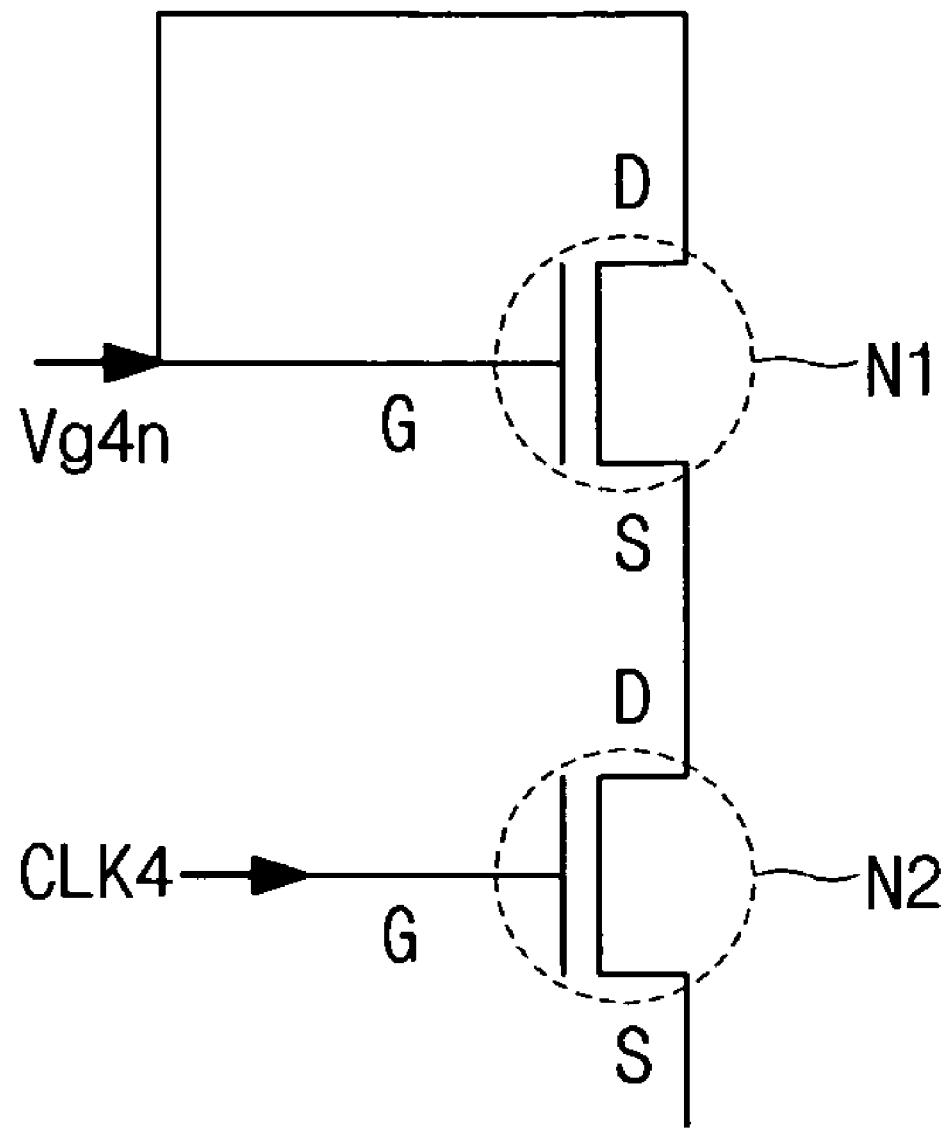

In FIG. 21, two transistors connected to each other in series are used instead of the first transistor of FIG. 19. As shown in FIG. 21, a source electrode of a first transistor "N1" is connected to a drain electrode of a second transistor "N2." A $4n^{th}$ output signal "Vg4n" of the previous shift register stage is input to a gate electrode and a drain electrode of the first transistor "N1" and a fourth enable control clock "CLK4" is input to a gate electrode of the second transistor "N2." Referring again to FIG. 12 as an example, the $4n^{th}$ output signal "Vg4n" corresponds to the fourth output signal "Vg4" and a high state of the fourth enable clock "CLK4" simultaneously begins with a high state of the fourth output signal "Vg4." Accordingly, the first and second transistors "N1" and "N2" in FIG. 21 function in accordance with the first transistor of FIG. 19. Even though not shown in FIG. 21, first, second and third enable control clocks "CLK1," "CLK2" and "CLK3" are input to the second transistor of $(4n+2)^{th}$, $(4n+3)^{th}$, $(4n+4)^{th}$ shift register stages, respectively.

Consequently, a driving circuit including a plurality of shift register stages for a flat panel display device according to the present invention sequentially generates output signals having an arbitrary shape by using two circulation clock groups including n-phase enable control clocks that determine an enable state of a shift register unit and m-phase form generation clocks that determine a shape of an output signal of a shift register stage. Accordingly, output signals having various shapes are obtained and the output signals may be varied even after the driving circuit is formed to improve the functions of the driving circuit in a display panel for the flat panel display device. In addition, since a large number of transistors are not required in the present invention, reliability and stability of the driving circuit are improved.

While the invention has been particularly shown and described with reference to illustrated embodiment(s) thereof, it will be understood by those skilled in the art that the foregoing and other changes in form and details may be made therein without departing from the spirit and scope of the invention.

What is claimed is:

1. A driving circuit for a flat panel display device, comprising:
   first and second generation units generating m-phase circulation enable control clocks and n-phase circulation from generation clocks;
   a plurality of shift register stages generating output signals by using the m-phase circulation enable control clocks and the n-phase circulation form generation clocks, each of shift register stages comprising:
      an input terminal receiving at least one of the m-phase circulation enable control clocks;
      first and second nodes outputting first and second signals, respectively, using the at least one of the m-phase circulation enable control clocks;
      a first transistor coupled to the first node and receiving one of the n-phase circulation form generation clocks;
      a second transistor coupled to the second node and the first transistor; and
      an output terminal between the first and second transistors and outputting one of the output signals; and
   a ground terminal and a voltage source terminal,
   wherein each of the shift register stages further includes third to at least seventh transistors each having a gate electrode, a source electrode and a drain electrode;
   wherein the drain electrode of the first transistor receives one of the n-phase circulation form generation clocks and the source electrode of the first transistor is coupled to the drain electrode of the second transistor;
   the source electrode of the second transistor is connected to the ground terminal; and
   the gate electrode of the third transistor is coupled to the drain electrode of the fifth transistor, the source electrode of a ninth transistor, the drain electrode of a tenth transistor, the gate electrode of a twelfth transistor and the gate electrode of the second transistor, and the drain electrode of the third transistor is coupled to the ground terminal.

2. The driving circuit of claim 1, wherein an output signal output from a previous shift register stage is input to the input terminal.

3. The driving circuit of claim 1, wherein the first and second signals have one of high and low states.

4. The driving circuit of claim 3, wherein the high state of the first signal and the low state of the second signal are shifted by the at least one of the m-phase circulation enable control clocks.

5. The driving circuit of claim 4, wherein the output signals are output while the first signal has the high state.

6. The driving circuit of claim 1, wherein a shape of the output signals is determined by the n-phase circulation form generation clocks.

7. The driving circuit or claim 1, wherein the m is equal to or greater than 3 and the n is equal to or greater than 2 when two of the output signals of the adjacent shift register stages do not overlap each other.

8. The driving circuit of claim 1, wherein the m is equal to or greater than p+2 and the n is equal to or greater than p+1 when each of the output signal has a pulse width of p*t, two of the output signals of the adjacent shift register stages overlap each other by (p−1)*t, wherein t is a pulse width of each of the m-phase circulation enable control clocks and p is an integer equal to or greater than 2.

9. The driving circuit of claim 1, wherein the plurality of shift register stages are formed in a display panel of the flat panel display device and the first and second generation units are formed in an external circuit outside the display panel.

10. The driving circuit or claim 1, wherein the drain electrode of the first transistor receives one of the n-phase circulation form generation clocks and the source electrode of the first transistor is coupled to the drain electrode of the second transistor;
the source electrode of the second transistor is coupled to the ground terminal; and
the gate electrode of the third transistor is coupled to the source electrode of the fourth transistor, the drain electrode of the fifth transistor and the gate electrode of the second transistor, and the drain electrode of the third transistor is coupled to the ground terminal.

11. The driving circuit of claim 10, wherein the gate electrode of the fourth transistor receives one of the m-phase circulation enable control clocks and the drain electrode of the fourth transistor is coupled to the voltage source terminal; and
the gate electrode of the fifth transistor is coupled to the output terminal of the previous shift register stage and the source electrode of the fifth transistor is coupled to the ground terminal.

12. The driving circuit of claim 11, wherein the gate electrode and the drain electrode of the sixth transistor are coupled to the output terminal of the previous shift register stage, and the source electrode of the sixth transistor is coupled to the drain electrode of the seventh transistor; and
the gate electrode of the seventh transistor receives another of the m-phase circulation enable control clocks, and the source electrode of the seventh transistor is coupled to the source electrode of the third transistor and the gate electrode of the first transistor.

13. The driving circuit of claim 1, wherein the drain electrode of the fourth transistor is connected to the voltage source terminal, the gate electrode of the fourth transistor receives one of the m-phase circulation enable control clocks, and the source electrode of the fourth transistor is coupled to the drain electrode of the eighth transistor and the gate electrode of the ninth transistor; and
the gate electrode of the fifth transistor is coupled to the output terminal of the previous shift register stage and the source electrode of the fifth transistor is coupled to the ground terminal.

14. The driving circuit of claim 13, wherein the gate electrode of the sixth transistor is coupled to the output terminal of the previous shift register stage, the drain electrode of the sixth transistor is coupled to one of the output terminal of the previous shift register stage and the voltage source terminal, and the source electrode of the sixth transistor is coupled to the drain electrode of the seventh transistor, the source electrode of the third transistor, the gate electrode of the eighth transistor, the gate electrode of the tenth transistor, the gate electrode of the eleventh transistor and the gate electrode of the first transistor; and
the gate electrode of the seventh transistor is coupled to the output terminal of a shift register stage after the next shift register stage, and the source electrode of the seventh transistor is coupled to the ground terminal.

15. The driving circuit of claim 14, wherein the source electrode of the eighth transistor is coupled to the ground terminal;
the drain electrode of the ninth transistor is coupled to the voltage source terminal;
the source electrode of the tenth transistor is coupled to the ground terminal;
the drain electrode of the eleventh transistor is coupled to the drain electrode of the first transistor, and the source electrode of the eleventh transistor is coupled to the drain electrode of the twelfth transistor; and
the source electrode of the twelfth transistor is coupled to the ground terminal.

16. The driving circuit of claim 15, wherein the gate electrode of the thirteenth transistor receives another of the m-phase circulation enable control clocks;
the drain electrode of the thirteenth transistor is coupled to the source electrode of the sixth transistor; and
the source electrode of the thirteenth transistor is coupled to the drain electrode of the seventh transistor, the drain electrode of the third transistor, the gate electrode of the eighth transistor, the gate electrode of the tenth transistor, the gate electrode of the eleventh transistor and the gate electrode of the first transistor.

17. A driving circuit for a flat panel display device, comprising:
first and second units generating m-phase circulation enable control clocks and n-phase circulation form generation clocks;
a plurality of shift register stages generating output signals by using the m-phase circulation enable control clocks and the n-phase circulation form generation clocks, each of shift register stages comprising:
an input terminal receiving at least one of the m-phase circulation enable control cloks;
first and second nodes outputting first and second signals, respectively, using the at least one of the m-phase circulation enable control clocks;
a first transistor coupled to the first node and receiving one of the n-phase circulation form generation clocks;
a second transistor coupled to the second node and the first transistor; and
an output terminal between the first and second transistors and outputting one of the output signals; and
a ground terminal and a voltage source terminal, wherein each of the shift register stages further includes third to at least seventh transistors each having a gate electrode, a source electrode and a drain electrode;

wherein the chain electrode of the first transistor receives one of the n-phase circulation form generation clocks and the source electrode of the first transistor is coupled to the drain electrode of the second transistor;

the source electrode of the second transistor is coupled to the ground terminal; and the gate electrode of the third transistor is coupled to the drain electrode of the fifth transistor, the source electrode of a ninth transistor, the drain electrode of a tenth transistor, the gate electrode of a twelfth transistor and the gate electrode of the second transistor, and the drain electrode of the third transistor is coupled to the ground terminal.

18. The driving circuit of claim 17, wherein the drain electrode and the gate electrode of the fourth transistor are coupled to the voltage source terminal, and the source electrode of the fourth transistor is coupled to the drain electrode of the eighth transistor and the gate electrode of the ninth transistor; and the gate electrode of the fifth transistor is coupled to the output terminal of the previous shift register stage and the source electrode of the fifth transistor is coupled to the ground terminal.

19. The driving circuit of claim 18, wherein the gate electrode of the sixth transistor is coupled to the output terminal of the previous shift register stage, the drain electrode of the sixth transistor is coupled to one of the output terminal of the previous shift register stage and the voltage source terminal, and the source electrode of the sixth transistor is coupled to the drain electrode of the seventh transistor, the source electrode of the third transistor, the gate electrode of the eighth transistor, the gate electrode of the tenth transistor, the gate electrode of the eleventh transistor and the gate electrode of the first transistor; and the gate electrode of the seventh transistor receives one of the m-phase circulation enable control clocks, and the source electrode of the seventh transistor is coupled to the ground terminal.

20. The driving circuit of claim 19, wherein the source electrode of the eighth transistor is coupled to the ground terminal;

the drain electrode of the ninth transistor is coupled to the voltage source terminal;

the source electrode of the tenth transistor is coupled to the ground terminal;

the drain electrode of the eleventh transistor is coupled to the drain electrode of the first transistor, and the source electrode of the eleventh transistor is coupled to the drain electrode of the twelfth transistor; and the source electrode of the twelfth transistor is coupled to the ground terminal.

21. The driving circuit of claim 20, wherein the gate electrode of the thirteenth transistor receives another of the m-phase circulation enable control clocks;

the drain electrode of the thirteenth transistor is coupled to the source electrode of the sixth transistor; and the source electrode of the thirteenth transistor is coupled to the drain electrode of the seventh transistor, the drain electrode of the third transistor, the gate electrode of the eighth transistor, the gate electrode at the tenth transistor, the gate electrode of the eleventh transistor and the gate electrode of the first transistor.

22. A flat panel display device comprising:
a substrate;
a gate line on the substrate;
a data line crossing the gate line to define a pixel region;
a pixel transistor connected to the gate line and the data line;
first and second generation units generating m-phase circulation enable control clocks and n-phase circulation form generation clocks;
a plurality of shift register stages at a periphery of the pixel region and supplying output signals to the pixel region by using the m-phase circulation enable control clocks and n-phase circulation form generation clocks, each of the shift register stages comprising:
an input terminal receiving at least one of the m-phase circulation enable control clocks;
first and second nodes outputting first and second signals, respectively, using the at least one of the m-phase circulation enable control clocks;
a first transistor coupled to the first node and receiving one of the n-phase circulation form generation clocks;
a second transistor coupled to the second node and the first transistor; and
an output terminal between the first and second transistors and outputting one of the output signals; and
a ground terminal and a voltage source terminal,
wherein each of the shift register stages further includes third to at least seventh transistors each having a gate electrode, a source electrode and a drain electrode;
wherein the drain electrode of the first transistor receives one of the n-phase circulation form generation clocks and the source electrode of the first transistor is coupled to the drain electrode of the second transistor;
the source electrode of the second transistor is connected to the ground terminal; and
the gate electrode of the third transistor is coupled to the drain electrode of the fifth transistor, the source electrode of a ninth transistor, the drain electrode of a tenth transistor, the gate electrode of a twelfth transistor and the gate electrode of the second transistor, and the drain electrode of the third transistor is coupled to the ground terminal.

23. The flat panel display device of claim 22, wherein at least one of the shift register stages comprises:
an input terminal receiving at least one of the m-phase circulation enable control clocks;
first and second nodes outputting first and second signals, respectively, using the at least one of the m-phase circulation enable control clocks;
a first transistor coupled to the first node and receiving one of the n-phase circulation form generation clocks;
a second transistor coupled to the second node and the first transistor; and
an output terminal between the first and second transistors and outputting one of the output signals.

24. The flat panel display device of claim 22, wherein the flat panel display device is one of a liquid crystal display device and an organic electroluminescent display device.

* * * * *